United States Patent
Munks et al.

(10) Patent No.: US 6,289,028 B1
(45) Date of Patent: *Sep. 11, 2001

(54) METHOD AND APPARATUS FOR MONITORING AND CONTROL OF LASER EMISSION WAVELENGTH

(75) Inventors: Timothy C. Munks, Crystal Lake, IL (US); David J. Allie, Storrs, CT (US); Paul E. Dunn, Westfield, MA (US)

(73) Assignee: Uniphase Telecommunications Products, Inc., Bloomfield, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/231,913

(22) Filed: Jan. 14, 1999

Related U.S. Application Data

(63) Continuation-in-part of application No. 09/025,987, filed on Feb. 19, 1998, now Pat. No. 6,134,253.

(51) Int. Cl.[7] .......................................... H01S 3/10
(52) U.S. Cl. ................... 372/20; 372/32; 372/34
(58) Field of Search ................. 372/20, 32, 34, 372/29.014, 29.021, 31

(56) References Cited

U.S. PATENT DOCUMENTS

| | | | |
|---|---|---|---|
| 4,815,081 | 3/1989 | Mahlein et al. | 372/32 |
| 4,913,525 | 4/1990 | Asakura et al. | 350/162.12 |
| 5,068,864 | 11/1991 | Javan | 372/32 |

(List continued on next page.)

FOREIGN PATENT DOCUMENTS

| | | |
|---|---|---|
| 0 516 318 A2 | 12/1992 | (EP) . |
| 0 516 318 A3 | 12/1992 | (EP) . |
| 0 818 859 A1 | 7/1996 | (EP) . |

(List continued on next page.)

OTHER PUBLICATIONS

"Properties of Loss–Coupled Distributed Feedback Laser Arrays for Wavelength Division Multiplexing Systems", by Stefan Hansmann, et al., *Journal of Lightwave Technology*, vol. 15, No. 7 (Jul. 1997).

"Single–Angled–Facet Laser Diode for Widely Tunable External Cavity Semiconductor Lasers with High Spectral Purity", by P.J.S. Heim, et al., *Electronics Letters*, vol. 33, No. 16 (Jul. 31, 1997).

"Monolithic Mode–Locked Semiconductor Laser for Continuously Tunable Millimeter–Wave Transmission", by Dennis T.K. Tong, et al., *SPIE*, vol. 3038, (No Date).

(List continued on next page.)

*Primary Examiner*—James W. Davie
(74) *Attorney, Agent, or Firm*—McCormick, Paulding & Huber LLP

(57) ABSTRACT

An apparatus for monitoring and controlling the wavelength of laser radiation includes at a least one optical filter for receiving laser radiation and for transmitting and reflecting first and second filtered beams, respectively. Alternatively, the first and second beams may be transmitted by separate filters. The beams are filtered according to respective first and second spectral filter functions that cross at at least one crossing wavelength. A beam comparison element compares the first and second filtered beams and produces an error signal representative of the deviation of the wavelength of the laser radiation from a set-point wavelength. The beam comparison element can include first and second optical detectors and an error circuit for producing the error signal by taking a ratio or the difference of the signals detected by the detectors. Varying the angle of incidence of the laser radiation upon at least one optical filter varies the spectral filter function of that filter for selecting or varying the operating wavelength of the laser. A laser wavelength controller can receive the error signal for stabilizing or tuning the wavelength of the laser radiation. Several embodiments of the invention are disclosed.

7 Claims, 19 Drawing Sheets

U.S. PATENT DOCUMENTS

| | | | |
|---|---|---|---|
| 5,208,819 | 5/1993 | Huber | 372/32 |
| 5,287,367 | 2/1994 | Yanagawa | 372/31 |
| 5,299,212 | 3/1994 | Koch et al. | 372/32 |
| 5,323,409 | 6/1994 | Laskoskie et al. | 372/32 |
| 5,428,700 | 6/1995 | Hall | 372/32 |
| 5,544,183 | 8/1996 | Takeda | 372/38 |
| 5,691,989 | 11/1997 | Rakuljic et al. | 372/20 |
| 5,706,301 | 1/1998 | Lagerstrom | 372/32 |
| 5,780,843 | 7/1998 | Cliche et al. | 250/226 |
| 5,798,859 | 8/1998 | Colbourne et al. | 359/247 |
| 5,825,792 | 10/1998 | Villeneuve et al. | 372/32 |
| 5,867,513 | 2/1999 | Sato | 372/32 |
| 6,134,253 * | 10/2000 | Munks et al. | 372/38 |

FOREIGN PATENT DOCUMENTS

| | | |
|---|---|---|
| 58171880 | 10/1983 | (JP) . |
| 59201239 | 11/1984 | (JP) . |
| 04157780 | 5/1992 | (JP) . |
| 07007212 | 1/1995 | (JP) . |
| 09121070 | 5/1997 | (JP) . |
| 09219554 | 8/1997 | (JP) . |
| WO 97/05679 | 2/1997 | (WO) . |
| WO 97/07577 | 2/1997 | (WO) . |
| WO 98/50988 | 5/1998 | (WO) . |
| WO 99/04466 | 1/1999 | (WO) . |
| WO 99/08349 | 2/1999 | (WO) . |

OTHER PUBLICATIONS

"2.5 Gbit/s Directly–Modulated Fibre Grating Laser for WDM Networks", by F.N. Timofeev, et al., *Electronics Letters*, vol. 33, No. 16 (Jul. 31, 1997).

"2.5 Gbit/s Directly–Modulated Fibre Grating Laser for Optical Networks", by F.N. Timofeev, et al., *The Institution of Electrical Engineers*, 1997, (No Month).

"Visible Laser Sources Based on Frequency Doubling in Nonlinear Waveguides", by Jonas Webjorn, et al., *IEEE*, 1997. (No Month).

"Experimental Demonstration of an All–Optical Routing Node for Multihop Wavelength Routed Networks", by M. Shell, et al., *IEEE*, 1996 (No Month).

"Continuously Chirped DFB Gratings by Specially Bent Waveguides for Tunable Lasers", by Hartmut Hillmer, et al., *Journal of Lightwave Technology*, vol. 13, No. 9 (Sep. 1995).

"Spectral Dynamics of Widely Tunable Four–Section Sampled Grating DBR Lasers", by Gardiner, et al., Conference Proceedings—Lasers and Electro–Optics Society Annual Meeting Proceedings of the 1996 Conference on Lasers and Electro–Optics, ELEO'96 (Jun. 2–7, 1996).

"Optical Frequency Switching with SSG–DBR Structured Devices", by Hiroshi Yasaka, et al., *NTT Opto–Electronics Laboratories* (1995) (No Month).

"Wavelength Tuning in Three Section Sampled Grating DBR Lasers", C.K. Gardiner, et al., *Electronics Letters*, vol. 31, No. 15 (Jul. 20, 1995).

"A 2.5–Gbit/s Return–to–Zero Integrated DBR Laser/ Modulator Transmitter", by G. Raybon, et al., *IEEE Photonics Technology Letters*, vol. 6, No. 11 (Nov. 1994).

"Tunable Lasers for Photonic Integrated Circuits", by L.A. Coldren, et al., *LEOS Summer Topical Meeting Integrated Optoeelectronics Proceedings of the LEOS 1994 Summer Topical Meeting* (Jul. 6–8, 1994).

* cited by examiner

METHOD AND APPARATUS FOR MONITORING AND CONTROL OF LASER EMISSION WAVELENGTH

CROSS REFERENCE TO RELATED APPLICATIONS

This patent application is a continuation-in-part of U.S. application Ser. No. 09/025,987, entitled "Method and Apparatus For Monitoring And Control Of Laser Emission Wavelength" filed Feb. 19, 1998, and herein incorporated by reference now Pat. No. 6,134,253.

FIELD OF THE INVENTION

This invention relates to lasers and more particularly to apparatus for monitoring and controlling the wavelength of the laser radiation.

BACKGROUND OF THE INVENTION

In Dense Wavelength Division Multiplexing (DWDM), multiple light beams, each of a different wavelength and representing a distinct channel for the transmission of data, are combined (multiplexed) to propagate as a beam along a single optical beam path, such as a beam path defined by an optical fiber. The amount of information that can be carried along the beam path, e.g., by the fiber, is thus greatly increased. At the receiving end of the beam path the channels are de-multiplexed and appropriately demodulated. Each channel employs a laser light source, typically a semiconductor laser, such as a distributed feedback (DFB) laser or a distributed back reflection (DBR) laser, that produces a beam at the wavelength of that channel. A modulator modulates the beam to carry the channel's data. The development of a practical wide band amplifier that can be inserted in the optical beam path, such as the erbium doped fiber amplifier, has made DWDM a reality and spurred much technical innovation in related devices, such as multiplexers, demultiplexers, modulators, etc.

One important concern with DWDM systems is achieving higher data rates, such as by increasing the number of channels. The wavelength stability of the laser sources limits number of channels. The wavelength of a laser light source typically drifts over time, and the channels cannot be so closely spaced such that the wavelength of one channel laser source drifts too close to the wavelength at which another channel light source is operating. Information will be lost. Accordingly, the better the stabilization of the wavelength of the laser sources, the more densely the channels can be packed within a particular wavelength range.

For example, the wavelength of a DFB laser is known to be affected by several factors, such as laser source current, laser temperature, and aging of the laser. In most practical applications, the wavelength of the laser is stabilized by regulating the temperature of the laser, because changing the current affects the overall system power budget and provides a more limited range of wavelengths over which the laser can be tuned. DFB lasers are typically temperature stabilized using a thermal control loop consisting of a thermistor to sense the device temperature, an electronic feedback loop, and a thermoelectric cooler (TEC) that responsive to feedback adjusts the temperature of the laser. Thermal regulation is employed because it also protects the DFB laser from overheating, and helps to stabilize power output of the laser. However, laser drift is still a concern and limits the density of channels. Improvement is required to more densely pack channels, and hence obtain higher data rates, in DWDM systems.

Another important concern in implementing a DWDM system is wavelength management and optimization. System designers face difficult problems when optimizing a DWDM link. They need to minimize losses, yet maintain adequate channel isolation and consider other parameters relating to wavelength. Several components within a DWDM system, such as optical amplifiers (e.g. an erbium doped fiber amplifier), multiplexers, demultiplexers, optical isolators, add/drop multiplexers and couplers, are sensitive to wavelength. Fiber dispersion is also a consideration. Control, e.g., tuning, of the wavelength of individual channels within available channel bandwidths is not typically fully realized as an optimization tool.

Yet another concern in operating such systems involves monitoring the laser radiation used for some, or all, of the channels. As noted above, the wavelength is known to vary with the electrical current supplied to the laser, the temperature of the laser, and with the aging of the laser. Monitoring of the wavelengths can be useful in maximizing performance of the overall information transmission system.

The problems of wavelength regulation, control, and monitoring have not been satisfactorily resolved. Better wavelength monitoring, regulation and control will allow higher performance laser information systems that are more readily designed, maintained and modified, and denser packing of channels, and hence higher data rates. Fewer types of lasers could achieve a given number of communication channels. Existing methods and apparatus are not entirely adequate.

Accordingly, it is an object of the invention to address one or more of the aforementioned disadvantages and drawbacks of the prior art.

Other objects of the invention will in part be apparent and in part appear hereinafter.

SUMMARY OF THE INVENTION

The present invention achieves these and other objects by providing an apparatus for monitoring the wavelength of laser radiation to produce an error signal representative of the deviation of the wavelength from a set-point wavelength. The error signal can be used as part of a feedback loop to monitor, stabilize, tune, or otherwise control the wavelength of the laser, for example, by controlling the temperature of the laser or the current supplied to the laser. Modifying the manner in which the error signal is produced biases, or varies, the set-point wavelength, hence tuning the wavelength of the laser.

In one aspect, the invention provides an apparatus for monitoring the wavelength of laser radiation, including an optical beam splitting apparatus for splitting first and second split beams from a beam to be monitored. A first optical filter is responsive to the first split beam for producing therefrom a first filtered beam in accordance with a first spectral filter function; a second optical filter is responsive to the second split beam in accordance with a second spectral filter function for producing a second filtered beam therefrom.

The first filter includes a substrate having a filter disposed therewith, and a surface of the substrate is disposed for receiving the first split beam at a non-zero angle of incidence. The non-zero angle can be selected such that the first and second spectral filter functions cross at a selected crossing wavelength, and such that they can define a capture range of wavelengths that includes at least a portion of the bandwidth of a channel of a DWDM system. The beam comparison element compares the first and second filtered beams for producing an error signal representative to the deviation of the wavelength of the beam from a set-point wavelength, which can correspond to the crossing wavelength.

In another aspect, the invention provides a wavelength-stabilized laser system that includes a laser for producing a beam of laser radiation having a selected wavelength, and an element for splitting first and second laser light beams from the beam of laser radiation. A first optical filter is disposed for receiving at least a portion of the first split beam. The first filter produces a first filtered beam, and a photodetector is arranged for receiving at least a portion of the first filtered beam and for producing a first detected signal. A second optical filter is disposed for receiving at least a portion of the second split beam and for producing a second filtered beam, and a second photodetector receives at least a portion of the second split beam and produces a second detected signal. The first filter includes a substrate having a filter layer, the filter layer including at least one film layer having a dielectric constant differing from that of the substrate. An error signal circuit is in electrical communication with the first and second photodetectors for generating an error signal responsive to the first and second detected signals and representative of the deviation of the wavelength of the laser radiation from a set-point wavelength. A laser wavelength control element is in electrical communication with the error circuit for adjusting the operating temperature of the laser in response to the error signal such that the wavelength of the laser tends toward the set-point wavelength. The first split beam is incident on a surface of one of the substrate and the filter layer at a non-zero angle of incidence selected such that the first and second spectral filter functions define a wavelength capture range including the set-point wavelength.

According to yet another aspect of the invention, an apparatus for monitoring the wavelength of a beam of laser radiation includes at least one optical filter. The optical filter includes a substrate having a filter layer, and the filter layer includes at least one film layer having a dielectric constant differing from that of the substrate. The optical filter receives at least a portion of the beam at a selected non-zero angle of incidence to a surface of one of the substrate and the filter layer for producing a first filtered beam in accordance with a first spectral filtering function having a resonant response at a resonant response wavelength. At least one detector detects the first filtered beam to produce a first detected signal responsive to the intensity of the first filtered beam. An error circuit in electrical communication with the detector produces, responsive to the detected signal, an error signal representative of the deviation of the wavelength of the beam from a set-point wavelength. The non-zero angle of incidence is chosen such that the spectral filter function defines a capture range of wavelengths that includes the set-point wavelength.

Also provided by the invention is an apparatus for monitoring the wavelength of laser radiation that includes a beam splitting apparatus disposed for splitting first and second split beams from a beam; a first optical filter for receiving the first split beam and for producing therefrom a first filtered beam in accordance with a first spectral filtering function; a second optical filter for receiving the second split beam and for producing therefrom a second filtered beam in accordance a second spectral filtering function differing from the first spectral filtering function; first and second photodetectors for receiving at least a portion of the first and second filtered beams respectively, and for producing therefrom, respectively, first and second detected signals; and an error circuit for producing, responsive to the first and second detected signals, an output signal representative of the deviation of the monitored wavelength from a set-point wavelength.

The error circuit includes a summing circuit for summing the first and second signals to produce a summed signal; a first circuit element for determining a first ratio of a first reference voltage to the summed signal; and a second circuit element responsive to the first circuit element for multiplying the second signal by a factor substantially equal to the first ratio to produce an output signal representative of a ratio of the second signal divided by the sum of the first and second signals.

In yet an additional further aspect, the invention provides an apparatus for monitoring the wavelength of laser radiation that includes an optical filter for receiving a beam of laser radiation and for transmitting a first filtered beam in accordance with a first spectral filter function. In addition, the optical filter reflects a second filtered beam in accordance with a second spectral filter function inversely related to the first spectral filter function, the spectral filter functions crossing at first and second zero bias set-points. The optical filter includes a substrate having a filter layer on a first surface thereof, the filter layer including at least one film layer having a dielectric constant differing from that of the substrate. A beam comparison element compares the intensities of the first and second filtered beams for producing a signal representative of the deviation of the wavelength of the beam from a set-point wavelength.

In another aspect, the invention provides a semiconductor laser apparatus that includes provision for sampling the laser radiation for at least monitoring the wavelength of the laser radiation. The laser apparatus includes a semiconductor laser for producing a first beam of laser radiation from a first facet thereof and a second beam from a second facet thereof, and an optical filter for receiving the second beam of laser radiation and for transmitting a first filtered beam in accordance with a first spectral filter function and for reflecting a second filtered beam in accordance with a second spectral filter function inversely related to said first spectral filter function such that an error signal representative of the deviation of the wavelength the laser radiation from a setpoint wavelength can be obtained by comparing the filtered beams. The filter and laser can be mounted on a thermal conductor, and the apparatus can further include a modulator and/or a fiberoptic coupler for providing a fiber optic output for the first beam. The laser can be a tunable laser.

The invention also includes methods practiced in accordance with the teachings herein, as described in more detail below.

The present invention thus provides a laser wavelength monitoring and/or control apparatus that is stable under changing environmental conditions and insensitive to aging effects, in part due to the use of optical filters whereby the film layers are deposited with a high energy deposition process. A wavelength monitoring apparatus according the invention is intended to be economically and relatively easily incorporated into laser communication system, such as DWDM systems, for tuning and stabilizing the channel wavelengths.

The foregoing and other objects, advantages and features of the invention will be apparent from the following description and the accompanying drawings, in which like reference numbers refer to like parts throughout the views. The drawings illustrate principles of the invention, though not drawn to scale.

DETAILED DESCRIPTION OF THE PREFERRED EMBODIMENTS

Figure 1:
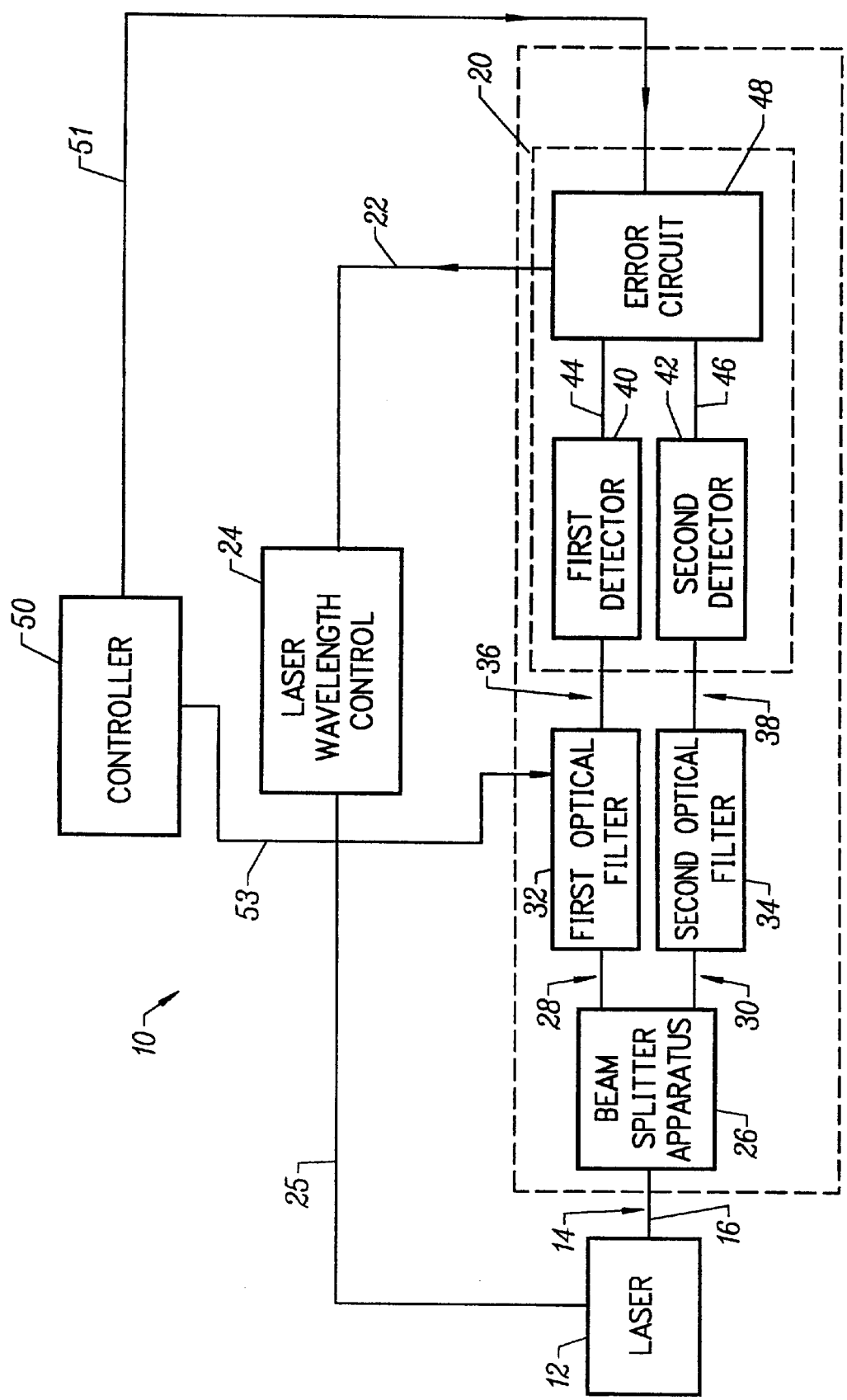
FIG. 1 is a block diagram of laser system including a laser wavelength monitoring apparatus according to the present invention

FIG. 1 illustrates generally a laser system 10 incorporating a wavelength monitoring apparatus 18 according to the present invention. A laser 12 radiates a beam 14 to be monitored along an optical path 16, which can be a free-space optical-path, or defined by an optical waveguide, such as an optical fiber. The wavelength monitoring apparatus 18 receives the beam 14 and produces an error signal representative of the deviation of the wavelength of the beam 14 from a selected set-point wavelength. The wavelength monitoring apparatus 18 communicates the error signal, as indicated by reference numeral 22, to a laser wavelength controller 24 that, responsive to the error signal, controls the wavelength of the beam 14 to reduce the error signal, thus driving the wavelength of the beam 14 towards the set-point wavelength. The laser wavelength controller 24 can, for example, control the temperature of the laser source 12 or the excitation current supplied to the laser 12. The laser wavelength can thus be controlled, such as for tuning or stabilizing the wavelength. The laser wavelength controller can include a proportional, integrating, differential (PID) circuit, as is known in the art. If the laser wavelength controller controls the temperature of the laser, the controller can be responsive to a temperature sensor that senses the temperature of the laser.

Many types of lasers 12 are known in the art and are employed in a variety of applications, and can benefit from the monitoring, control, and stabilization provided by the present invention. The distributed feedback laser is discussed below as one example; other examples subsequently follow. For example, the laser 12 can be 980 nm laser used as a pump for an erbium doped fiber amplifier (EDFA). The performance of the EDFA typically requires controlling the wavelength of the pump laser to maximize absorption of the pump laser energy by the EDFA. The laser 12 can also be a distributed feedback (DFB) laser; a distributed back reflection (DBR) laser, a super structure grating distributed back reflection laser (SSG-DBR), and grating assisted coupler with sampled rear reflector (GSCR) laser. Such lasers can be of particular benefit in Dense Wavelength Division Multiplexed (DWDM laser communication system. For example, a semiconductor laser operating at a frequency of, for example, 1550 nm, and that is tunable, such as over the 60 nm range, or a portion thereof, typical of the DWDM systems and of the EDFA in particular, can be of significant benefit. Fewer laser types are required for providing laser radiation at the various channel wavelengths. Each laser is tuned to operate at the particular wavelength of a particular channel. If the laser 12 is a Distributed Feedback (DFB) laser, as is often used in a Dense Wavelength Division Multiplexed (DWDM) laser communication system, the laser wavelength controller 24 preferably controls the temperature of the laser source 12.

Typically, the wavelength of a DFB laser will change about 0.1 nm /° C. Therefore, if the operating temperature is controlled to vary over a 20° C. range, it should be possible to vary the laser wavelength over a 2.0 nm span. As the wavelength drift of a DFB laser is typically not predictable, the set-point wavelength is typically selected to correspond to the center of this span as the safest operating point for long-term wavelength control of the laser source 12.

A controller 50, such as a personal computer or dedicated microprocessor, can be included for varying the set-point wavelength. Varying the set-point wavelength allows the wavelength of the laser 12 to be tuned, as is described in more detail hereinafter.

The wavelength monitoring system 18 can include a beamsplitter apparatus 26 for splitting the beam 14 into first and second split beams, 28 and respectively. A first optical filter 32 filters the first split beam 28 according to a first spectral filter function (SFF) to produce a first filtered beam 36; a second optical filter 34 filters the second split beam 30 according to a second SFF, which differs from the first spectral filter function, to produce a second filtered beam 38. A beam comparison element 20 receives and processes the filtered beams to produce the error signal for communication to the laser wavelength controller 24. Typically, the beam comparison element subtracts or takes a ratio of the filtered beams 36 and 38.

The first and second spectral filter functions differ such that the beam comparison element 20 can, by comparing the filtered beams 36 and 38, produce an error signal representative of the deviation of the wavelength of the beam 14 from the set-point wavelength. For example, as is discussed in more detail hereinafter, one useful spectral filter function can be characterized as having a bandpass bandwidth and a resonant response, at which the filtered beam transmitted or reflected from the filter is the least or most intense, at least locally. The resonant response occurs at a resonant response wavelength. One technique for facilitating production by the beam comparison element 20 of a useful error signal representative of the deviation of the wavelength of the beam 14 from a set-point wavelength is to select first and second SFF's wherein the resonant response wavelengths thereof differ by a selected amount. The range of wavelengths included between the resonant response wavelengths can correspond to a least a portion of the bandwidth of a particular channel of a DWDM system. The set-point wavelength can correspond to the wavelength at which the spectral filter functions cross, referred to herein at the crossing wavelength. Particular spectral filter functions are discussed in more detail hereinafter.

Accordingly, the beam comparison element 20 can include a first optical detector 40, a second optical detector 42, and an error circuit 48. The first optical detector 40 detects the first filtered beam 36, and communicates a first detected signal, as indicated by reference number 44, to the error circuit 48. Similarly, the second optical detector 42 detects the second filtered beam 38 and communicates a second detected signal, as indicated by reference number 46, to the error circuit 48. The error circuit 48 combines the detected signals, such as by taking a ratio involving the signals or subtracting the signals, to produce the error signal.

Preferably the beam comparison element compares the intensities of said first and second filtered beams. However, as understood by one of ordinary skill in the art, in light of the disclosure herein, the phase of the filtered beams can also be compared to produce the error signal representative of the deviation of the wavelength from the set-point wavelength.

As indicated in FIG. 1, the controller 50 can communicate with the error circuit 48 and/or one of the optical filters, such as the first optical filter 32, to control, respectively, the first spectral filter function and the combining of the detected signals, for varying the set-point wavelength. A set-point wavelength that differs from the crossing wavelength, when the concept of a crossing wavelength is relevant, is referred to herein as a biased set-point wavelength; the term set-point wavelength is used generally to include both set-point wavelengths that are crossing point wavelengths and set-point wavelengths biased therefrom. As discussed further below, a single SFF can be used for generating an error signal that is representative of the deviation of the laser wavelength from a set-point wavelength, though there is no crossing of SFF's and hence no relevant crossing wavelength.

Figure 2:
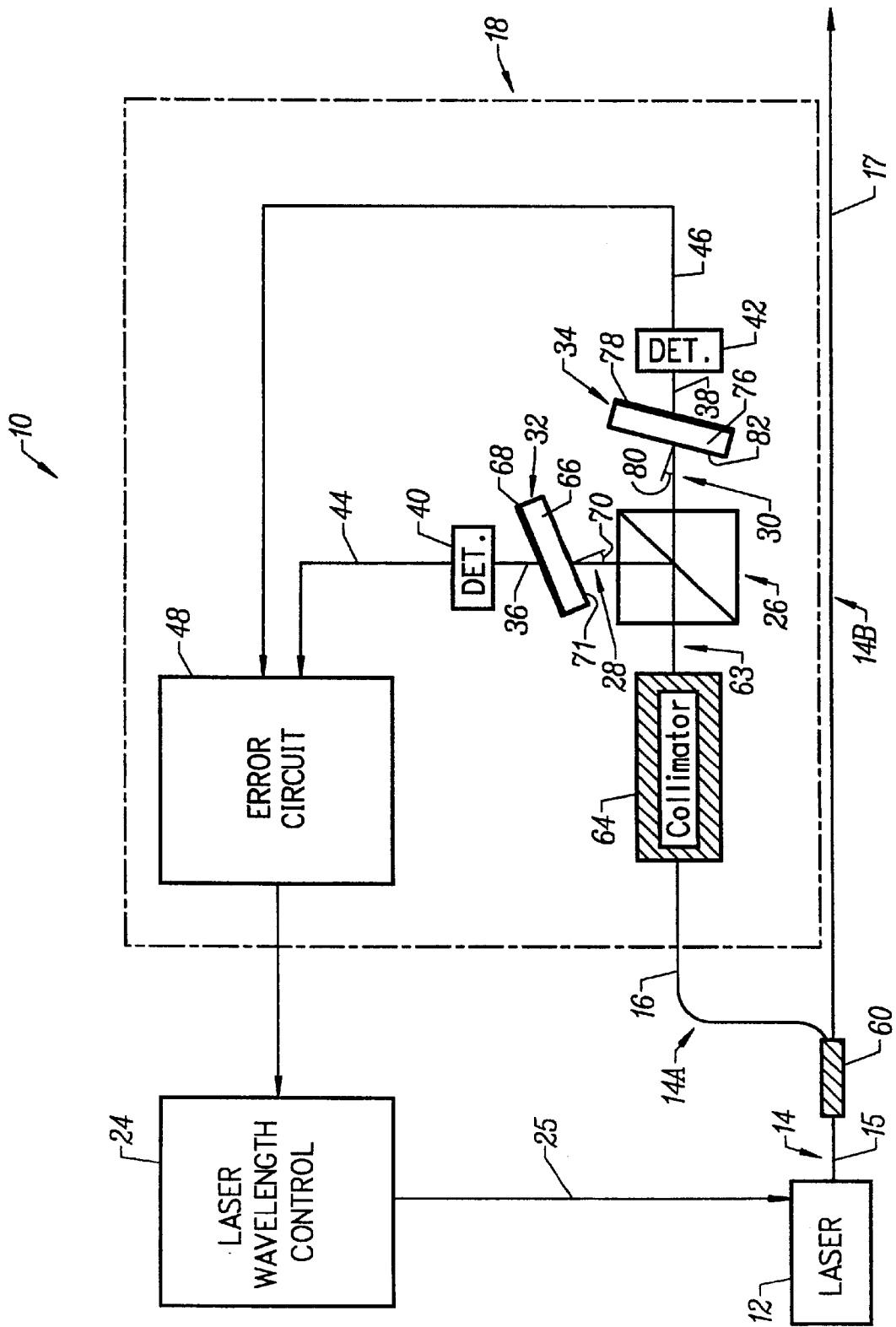
FIG. 2 is a schematic illustration of one embodiment of the laser system and laser wavelength monitoring apparatus of FIG. 1.

FIG. 2 illustrates one embodiment of a laser system 10 incorporating a wavelength monitoring apparatus 18 according to the present invention. The laser 12 generates a main beam 14 along a optical path 15 defined by an optical fiber. A fiberoptic coupler 60 couples a portion of the main beam 14 along an optical path 16, also defined by an optical fiber, as the beam 14A. The main beam 14 exits to the right of FIG. 2 as beam 14B along optical path 17, for further processing, such as modulation with a telecommunications signal.

The fiber optic collimator 64 collimates the beam 14B to travel the free space optical path 63 to the beam splitter apparatus 26, in this instance a typical free-space beam splitter known to those of ordinary skill in the art. The beam splitter apparatus 26 splits the beam 14B into first and second split beams, 28 and 30, respectively, that are filtered by first and second optical filters 32 and 34.

Preferably, the first and second optical filters, 32 and 34 respectively, are filters that include substrates 66 and 76, respectively, having filter layers 68 and 78, respectively, deposited thereon. Filter layer 68 is discussed as generally representative of both the filter layers 68 and 78. The filter layer 68 includes at least one film, typically having an optical length of a quarter wave at a selected wavelength, and having a dielectric constant, or equivalently, an index of refraction, differing from that of the substrate 66 or from one of any other films that make up the filter layer 68.

As shown in FIG. 2, the first split beam 28 is incident at selected angle 70 to a surface 71 of the first optical filter 32. The second optical filter 34 can also be disposed such that the second split beam is incident on surface 82 of the second filter at an angle 80. The spectral filter function of a given filter is a function of the substrate, the filter layer, and the angle of incidence the optical beam.

Figure 3A:
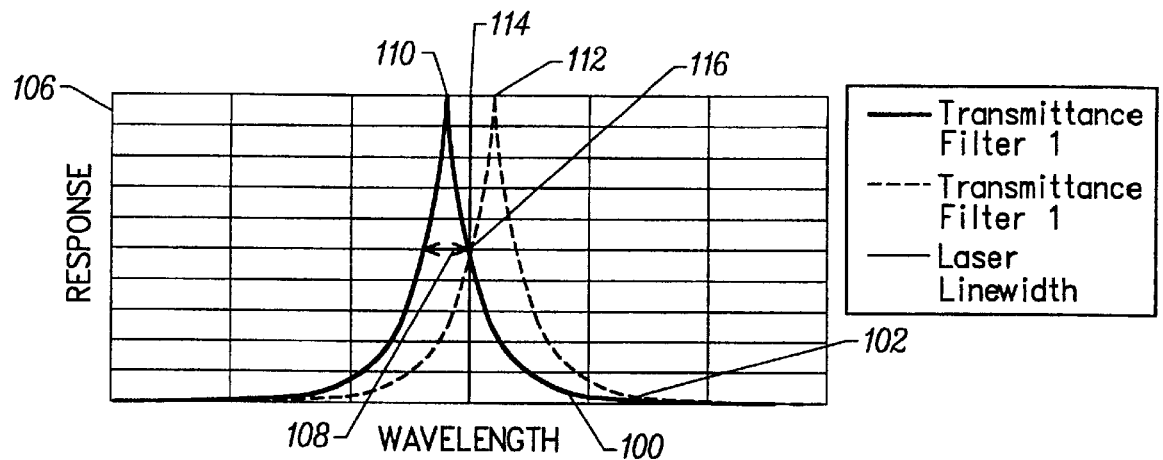
FIG. 3A illustrates typical first and second spectral filter functions corresponding to the first and second optical filters of FIG. 2.

FIG. 3A illustrates a first spectral filter function (SFF) 100 (indicated by a solid line) associated with the first optical filter 32 and a second SFF function 102 (indicated by a dotted line) associated with the second optical filter 34. Each SFF can be characterized as having a bandwidth, such as the width 108 at half height for the first SFF 100, and a resonant response, such as the resonant response 110 for the first SFF 100 and the resonant response 112 for the second SFF 102. The first and second SFF's differ primarily in that the wavelengths corresponding to the resonant response for each SFF are shifted from each other.

Figure 3B:
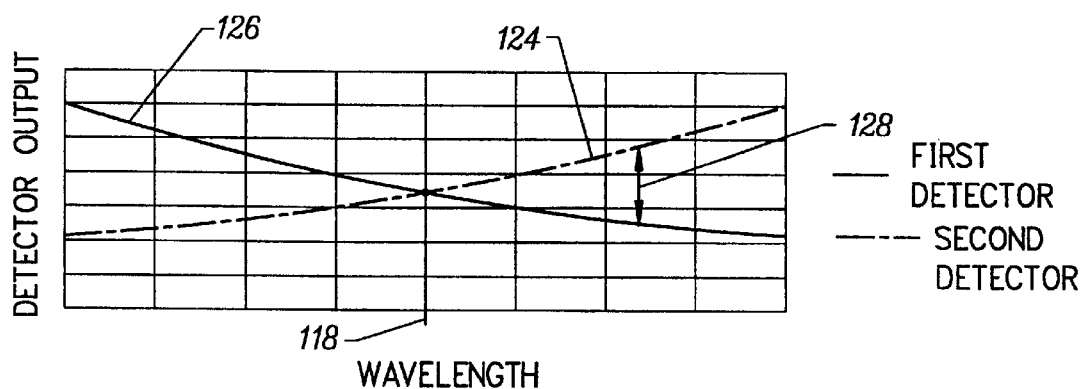
FIG. 3B illustrates the derivation of an error signal from the spectral filter functions of FIG. 3A.

The first SFF and second SFF cross at point 116 at the crossing wavelength indicated by reference numeral 118, which can correspond to the set-point wavelength. For example, at the operating wavelength of the laser 12, represented by the spectral line 114 in FIG. 3A, the first and second spectral filter functions, and hence the intensity of the first and second filtered beams, are equal. However, were the wavelength 114 of the beam 14 to shift to either side of the wavelength point 118, either the first SFF would increase and the second SFF decrease, or vice versa. Thus a beam comparison element 20 that subtracts or takes a ratio of signals, such as the first and second detected signals can produce an error signal representative of the deviation of the wavelength 114 from the set-point wavelength 118. FIG. 3B illustrates the variation of the first and second detected signals, 126 and 124 respectively, as a function of wavelength. The error circuit 48 can be a differencing circuit for taking the difference 128 between the first detected signal 126, indicated by a solid line, and the second detected signal 124, indicated by the dashed line. Such differencing error circuits are discussed in conjunction with FIG. 5.

One of ordinary skill in the art, in light of the disclosure herein, understands that different types of optical filters can operate to provide a spectral filter function in different manners. For example, light energy can be absorbed, reflected, or transmitted by an optical filter. The energy not absorbed is either transmitted or reflected, or both, and a filtered beam can correspond to a beam reflected, rather that transmitted, from a filter. Accordingly, as used herein, a resonant response can refer to a local or global maxima or minima (i.e. null) of a spectral filter function, and a filtered beam can include a beam reflected or transmitted from an optical filter. Furthermore, a filter can include several film layers deposited to form a filter layer, or can be formed from a grating disposed with a substrate, such as being etched on a surface of a substrate or otherwise formed within a substrate.

With reference again to FIG. 2, the first and second optical detectors, 40 and 42, respectively, are preferably PIN photodetectors operated in an unbiased transimpedance mode. For example, to operate the PIN photodetector in the unbiased transimpedance mode, one terminal of the PIN photodetector can be connected to the inverting input of an operational amplifier (not shown), and the other terminal can be grounded. The non-inverting input of the operational amplifier is also grounded, and a resistor couples the inverting input and the output of the operational amplifier. The detected signal is available in amplified form at the output of the operational amplifier.

The optical filters 32 and 34 and the detectors 40 and 42 function as a wavelength-to-voltage transducer. The error circuit 48 processes first and second detected signals and produces an error signal 22 wherein the voltage of the signal is representative of the deviation of the wavelength of the beam 14 (and hence of the main beam 13) from the set-point wavelength. One of ordinary skill in the art, possessed of the disclosure herein; appreciates that the PIN photodetectors 40 and 42 can also be operated in a photoconductive mode, such that the photodetectors 40 and 42 and optical filters 32 and 34 act as a wavelength-to-current transducer.

Varying the angle of incidence of a beam on a filter primarily shifts the wavelength corresponding to the resonant response of the SFF. Thus the first and second filters can be substantially physically identical, yet have the distinct spectral filter functions 110 and 112 because the filters are disposed at an angle to the respective beams incident thereon. Disposing the first or second, or both, filters at angle to an incident beam to vary the SFF of the filter is referred to herein as angle tuning, and can have significant benefits. For example, a 16 channel laser communication system having 16 laser sources, each operating at a different wavelength, can require 32 distinct spectral filter functions, (2 per laser wavelength, as in FIG. 2), and hence, in typical prior art systems, up to 32 physically distinct filters (e.g. filters having different filter layers, thickness thereof and/or substrates) to provide 32 different SFF's for wavelength monitoring and control of all the channels. However, using angle tuning according to the invention to vary the SFF of the filters, such a laser system may require as few as 3 or 4 physically distinct filters to obtain the 32 distinct spectral filter functions.

Figure 4A:
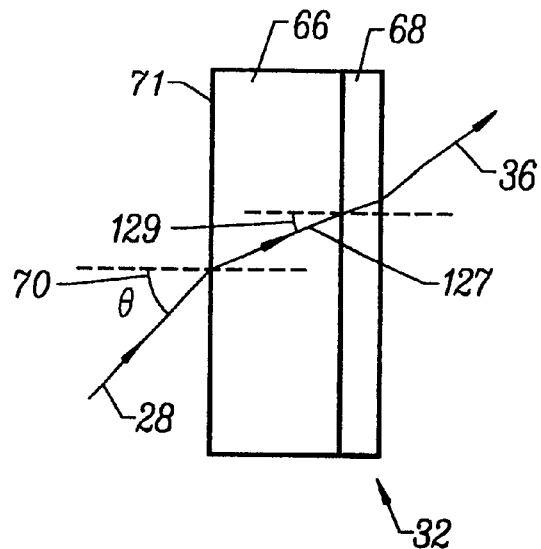
FIG. 4A illustrates the geometry of an optical beam incident on the optical filter of FIG. 2, and is useful in understanding the phenomenon of angle tuning a spectral filter function of FIG. 3A.
Figure 4B:
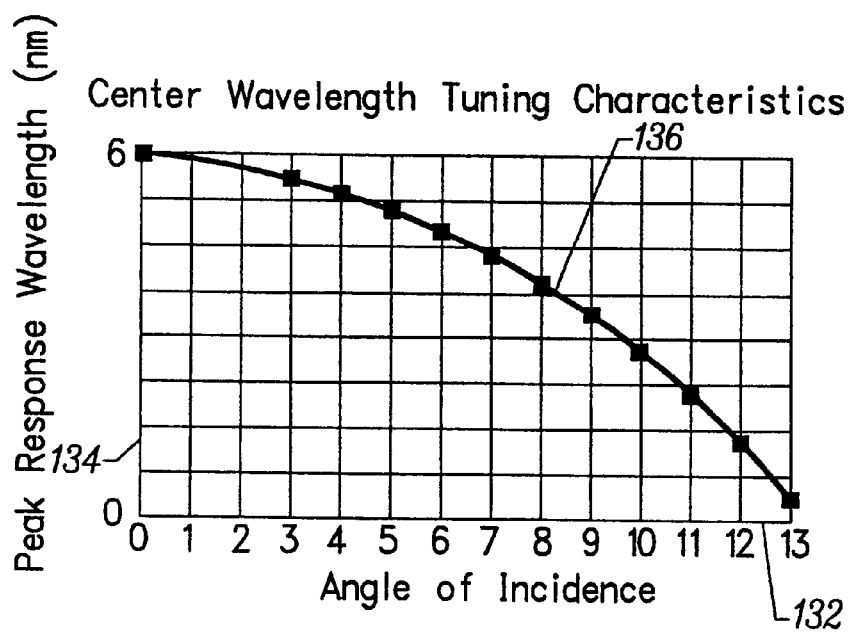
FIG. 4B illustrates the tuning of the resonant response wavelength of a spectral filter function as a function of the angle of incidence of the incident beam of laser radiation.

The variation of a spectral filter function of a filter with incident angle is illustrated in FIGS. 4A and 4B. Varying the angle of incidence 70 of an optical beam, such as the first split beam 28, on a surface 71 of an optical filter, such as the optical filter 32, varies the resonant response wavelength of the spectral filter function of the optical filter 32.

The resonant response wavelength is inversely proportional to the incident angle 129 of the beam 127 traveling in the optical filter 32, obeying the following relationship:

resonant response wavelength [$\lambda_o$, Cos ($\theta_i$)]

Where $_{—i}$ is the angle of incidence 129 of the beam 127 traveling within the optical filter 32 on the film layer 68, and $l_o$ is the resonant response wavelength when the angle of incidence 129 on the film layer 68 is 0 degrees. The angle of incidence 129 of the beam 127 on the film layer 68 on the film layer 68 is related to the incident angle 70 on the substrate 66 by Snell's law.

$\theta_i = \sin^{-1}(1/n(\sin(\theta)))$

Where q is the angle of incidence 70 of the beam 28 on the substrate 66 and n is the index of refraction of the substrate 66.

FIG. 4B illustrates the functional relationship 136 between the resonant response wavelength and the angle of incidence 70. Reference number 132 refers to the horizontal axis (degrees) and reference number 134 refers to the vertical axis (nanometers). Varying the incident angle 70 over approximately 13 degrees varies the resonant response wavelength over approximately 6 nanometers. A typical spectral filter function can have a 3 dB bandwidth of approximately 1 nanometer as depicted in FIG. 3A.

Note that the tuning characteristics of the optical filter 32 are a function of the refractive index of the substrate 66. The change in the resonant response wavelength of the optical filter 32 can be made more or less sensitive to the angle of incidence 70 by varying the refractive index of the substrate 66. For example, for an incident angle 70 on the substrate 66 of 8° and a wavelength of 1550 nm, the resonant response wavelength of an optical filter 32 having a substrate 66 of fused silica shifts by approximately ~6.6 nm, whereas when the substrate 66 is TaF$_3$, the resonant response wavelength only shifts by −2.5 nm. Accordingly, the refractive index of the substrate 66 can be used as a design parameter to customize the performance of the wavelength-to-electrical signal transducer formed by the first and second optical filters 32 and 34 and the first and second detectors 40 and 42.

In addition, the bandpass, such as the bandpass 108 shown in FIG. 3A, can be varied by varying the filter layer 68 to make the optical filter 32 more or less sensitive to changes in the wavelength of the beam 14. One of ordinary skill in the art, in light of the disclosure herein, understands that spectral filter function is related to the individual layer(s) that form the filter layer 68 on the substrate 66. The number of layers, the wavelength at which the layers are a quarter wave long, and the dielectric constant of each of the layers all effect the spectral filter function. To decrease the sensitivity of the optical filter 32, the bandpass of the spectral filter function can be broadened, thus flattening the slope of the detected signal 44 relative to a deviation of the wavelength of the beam 14 from the resonant response wavelength.

According to the invention, the optical filters shown on FIGS. 2 and 4 are advantageous for wavelength monitoring and control for reasons in addition to allowing the use of angle tuning to reduce the number of physically distinct filters required. One object of the present invention is to provide a wavelength monitoring apparatus that provides a stable and repeatable output over time, even when subject to varying environmental conditions. The filter layers 68 and 78 of the first and second optical filters 32 and 34 can be fabricated via the deposition of multiple dielectric quarter wave layers using an energetic deposition process such as ion beam or ion assisted sputtering on the optical substrate 66. Such energetic deposition processes can produce films that have packing densities close to unity and hence which are very robust relative to changing environmental conditions and aging.

Furthermore, the spectral filter function (SFF) of a filter is readily changed by changing the number and physical makeup of the filter, i.e., the dielectric constant and thickness, of the layers that make up the filter layer 68 on the substrate 66 and of the substrate 66. Thus the SFF can be easily changed to tailor a design for different applications. In addition, the filters are typically produced repeatably and at low cost.

The error circuit 48 preferably provides an error signal 22 that approaches zero when the wavelength of the beam 14 is equal to the set-point wavelength. Preferably, a set-point wavelength will remain stable for many years, over a wide temperature range, and over a reasonable range of optical power levels. One suitable approach is to apply a selected gain to each the first and second detected signals, 44 and 46, and to obtain the error signal by subtracting the first detected signal from the other, or vice versa. If the gain applied to the first and second detected signal are variable, it is possible to vary the set-point wavelength to produce a biased set-point wavelength, and to control the operating wavelength of the laser 12 over a selected range.

Figure 5C:
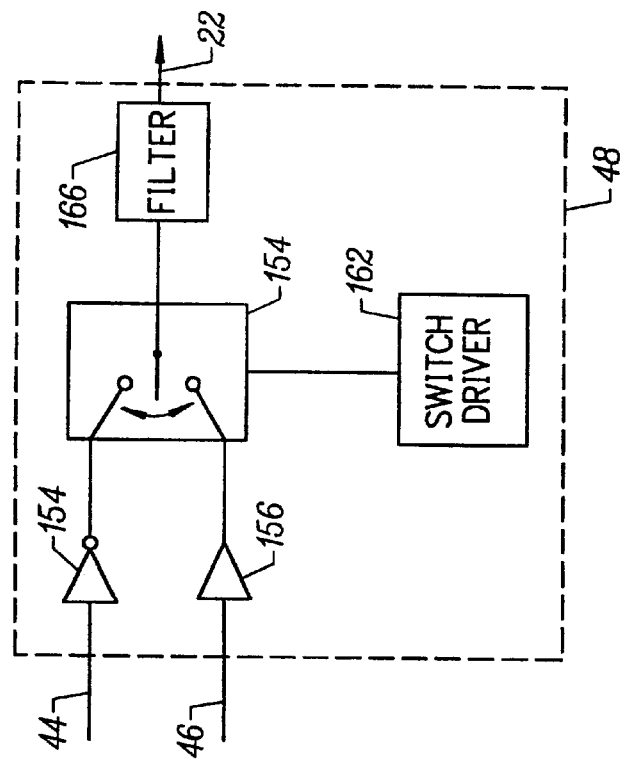
FIGS. 5A–5D schematically illustrate differencing error circuits for producing an error signal in accordance with the present invention.
Figure 5A:
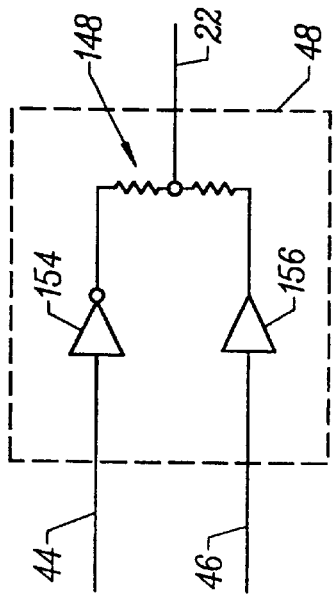
Figure 5B:
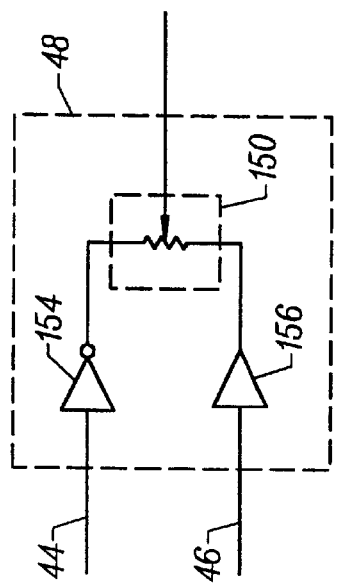
Figure 5D:
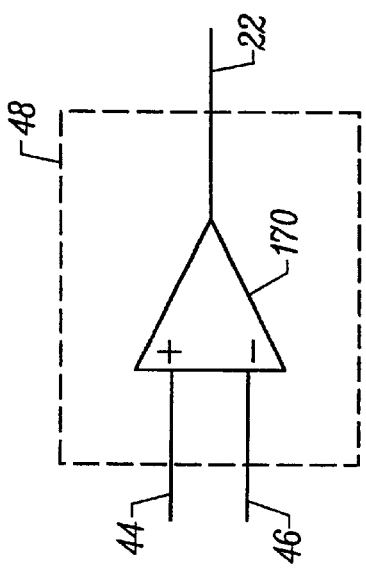

FIGS. 5A–5D illustrate differencing error circuits 28. Op amps 154 and 156 are configured as transconductance amplifiers and amplify, respectively, the first and second detected signals 44 and 46. The output of the op amp 154 is inverted. In FIG. 5A, the first and second detected signals are differenced with a simple two-resistor network 48. In FIG. 5B, the two resistors are configured as a potentiometer. Adjusting the potentiometer varies the gain of one detector signal with respect to the other, for biasing the set-point and hence varying the operating wavelength of the laser 12. The potentiometer 150 can be a conventional potentiometer or a digital potentiometer. In FIG. 5C, a driver 162 drives an analog switch 154 to rapidly switch back and forth between the first and second detected signals, 44 and 46, and the filter 166 filters the signal received from the switch 154. There are two advantages to this approach: first, the drift of one signal channel relative to the other is minimized, and second, the wavelength set-point can be biased by changing the duty cycle of the switch driver 162.

Figure 6:
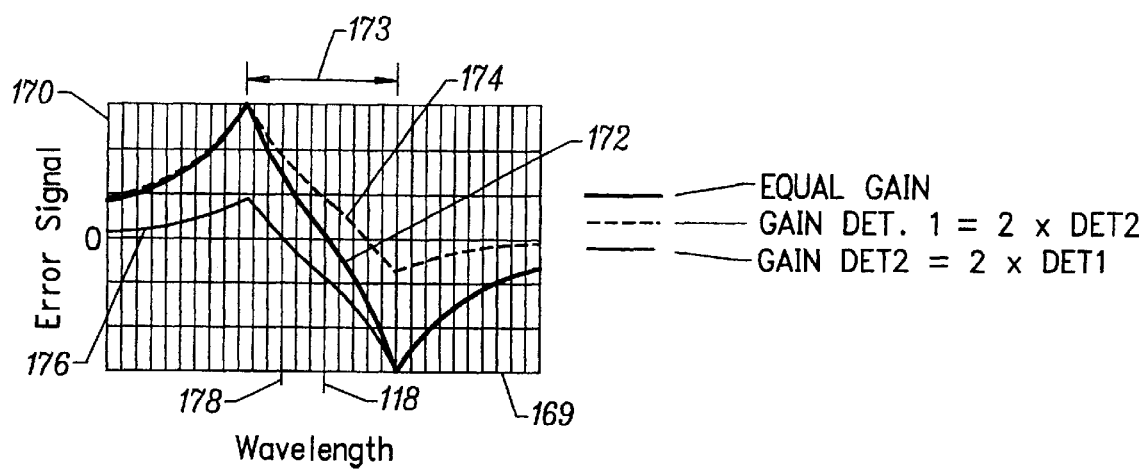
FIG. 6 illustrates the variation of the set-point wavelength and error signal by varying relative gain of the first and second amplifiers of the error circuits of the FIG. 5.

FIG. 6 illustrates the error signal produced by a typical differencing error circuit as a function of the gain of the transconductance op amps 154 and 156. The horizontal axis represents wavelength and the vertical axis the strength of the error signal 22. The curve 172 corresponds to equal gain of the first and second op amps, 154 and 156, respectively; the curve 174 corresponds to the second op amp 156 providing twice the gain of the first op amp 154; and the curve 176 corresponds to the first op amp 154 providing twice the gain of the second op amp 156. Note the biasing of the set-point wavelength. For example, if the set-point wavelength corresponds to a error signal of zero, the set-point wavelength varies from the set-point wavelength 188 for equal gain to the biased set-point wavelength 178 for the curve 176.

Reference numeral 173 indicates the wavelength tuning range corresponding to the equal gain curve 172. The term normal "tuning range," as used herein, indicates a range of wavelengths over which a unique error signal is produced for monitoring and controlling the wavelength of the beam 14, and hence of the laser 12. As understood by one of ordinary skill, in light of the disclosure herein, the tuning range 173 for the equal gain curve 173 can be determined by the separation in wavelengths between the resonant response wavelengths corresponding to the resonant responses 110 and 112 of the first and second spectral filter functions, 100 and 102 respectively, in FIG. 3A. Outside of the normal tuning range a given value of the error signal can correspond to more than one wavelength of the beam, and the error signal does not uniquely represent the deviation of the wavelength of the beam from the set-point wavelength.

The task of tuning the wavelength of the laser or providing a simple wavelength to voltage (or current) transducer becomes more complicated for wavelengths outside of the tuning range. However, outside the normal tuning range, provision can made for determining whether the laser wavelength is on a negative or positive slope of a spectral filter function, or as appropriate, an error signal versus wavelength curve, so as to determine which of the more than one possible value of the error signal curve or SFF represents the wavelength of the laser.

However, it has been found that in wavelength stabilization applications, the capture range of laser wavelengths can be larger than the above defined tuning range. The capture range is that range of laser wavelength within which the wavelength of the laser can be "captured" and, via feedback of the error signal to the laser wavelength controller, driven to or near the set-point wavelength. For example, for the curve 172, the capture range is at least as large as the whole range of wavelengths shown. Within the capture range. With reference to the curve 172, within the capture range the error signal is representative of the deviation from the set-point wavelength in that it is of one polarity for laser wavelengths less than the set-point wavelength and of an opposite polarity for signal greater than the set-point wavelength. In addition, the error signal approaches zero as the laser wavelength approaches the set-point wavelength.

Figure 7B:
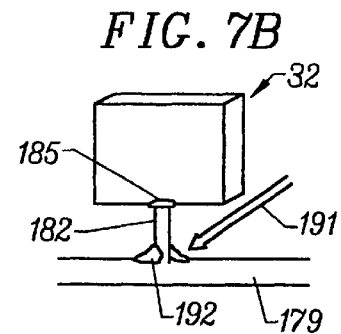
FIG. 7B illustrates fixing first optical filter of FIG. 3A in place using laser welding.
Figure 7A:
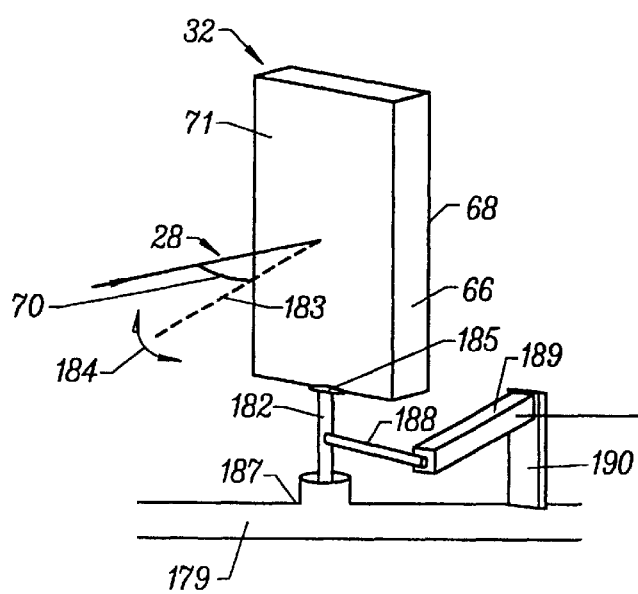
FIG. 7A illustrates mechanically varying the angle of incidence of a beam on a surface of the first optical filter of FIG. 2 for varying the spectral filter function, including the resonant response wavelength thereof.

FIG. 7A illustrates mechanically positioning the first optical filter 32 to vary the angle of incidence 70 of the first split beam 28 on the surface 71 of the substrate 66, thereby varying the first spectral filter function as discussed above. A support element 182, such as a shaft, supports the first filter 32 and is affixed thereto such as by the epoxy 185. The mount 187 rotationally couples the support element 182 to a frame or optical bed 179. The support element 182 includes an arm 188 for rotating the element 182 so as to vary the angle of incidence 70. The controller 50 can control a piezoelectric transducer 189 that "grows" or "contracts" in response to an applied voltage to rotate the first filter 32 as indicated by the arrow 184 to vary the angle of incidence 70. A second support element 190 can secure the piezoelectric transducer 189 to the frame 179. Varying the position, as indicated in FIG. 7A, of one or both of first and second optical filters 32 and 34 can vary the crossing wavelength, thus tuning the wavelength of the beam, by varying the wavelength at which the first and second filter functions intersect or cross, i.e., varying the wavelength at which they are substantially equal. Alternatively, the first optical filter 32 can be mounted to a stepper motor for positioning the filter to vary the angle of incidence, and the stepper motor can be controlled by the controller 50.

One of ordinary skill appreciates, in light of the disclosure herein, that rather than vary the position of the first optical filter 32, the first optical filter 32 can be laser welded as in FIG. 7B, or otherwise secured, and a beam directing element for varying the angle of incidence 70 can be inserted, for example, upstream of the optical filter 32. The mechanical position of the beam directing element be varied, such as by a piezoelectric transducer 189 or a stepper motor, to vary the angle of incidence 70. Such modification is deemed within the scope of the invention.

FIG. 7B illustrates laser welding the support element 182 to the frame or optical bed 179 using a laser beam 191 to create the laser weld 192. The first filter 32 is typically manually rotated to obtain a desired SFF and then laser welded in place. Laser welding fixes the first filter support 182 to the frame 179 in a more robust and environmentally stable manner than prior art methods, such as soldering or using epoxy. The use of angle tuning, which reduces the number of different filters required for a given laser system, in conjunction with laser welding of the filters in place, is advantageous over prior art designs as it reduces the number of parts, simplifies the manufacturing process, and leads to less variation of the performance of a wavelength monitoring apparatus 18 due to aging and environmental conditions, producing a more robust laser system 10 for use, for example, in DWDM systems.

For convenience, the first optical filter 32 is shown in FIGS. 7A and 7B as physically larger than the support element 182, though typically the reverse is true. Laser welding the support element 182 to the frame 179 is considered superior to prior art methods, such as epoxying or soldering, for securing the mass of the support element 182 and the first optical filter 32 to maintain the angle of incidence 70 over extended periods of time and changing environmental conditions. The epoxy 185 is acceptable for securing the first optical filter 32 to the support element 182, as such epoxy 185 need only secure the mass of the filter.

Figure 8:
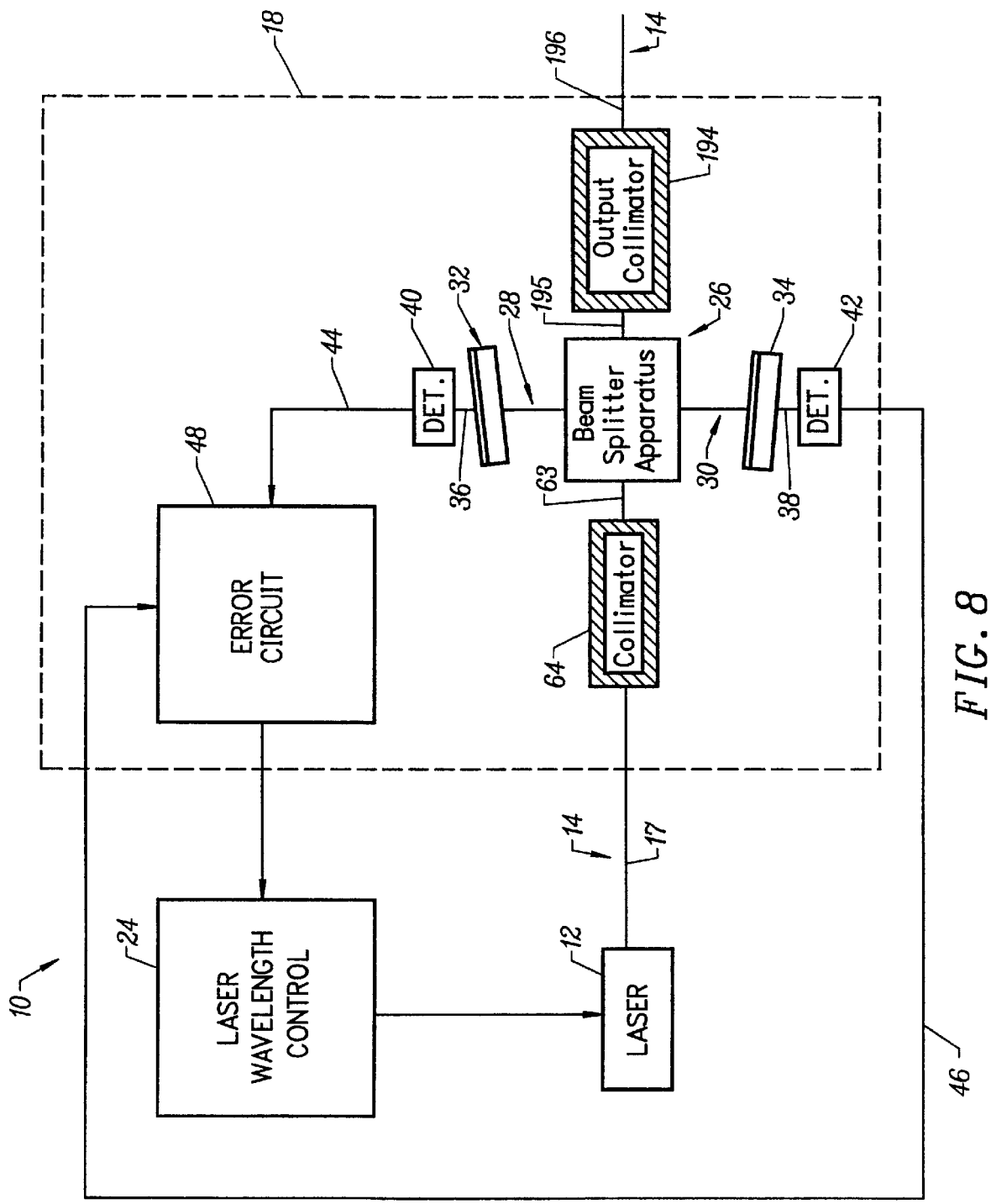
FIG. 8 illustrates an "in-line" alternative embodiment of the laser system including a wavelength monitoring system of FIG. 1.

FIG. 8 illustrates an alternative embodiment of the a wavelength monitoring apparatus 18 and of a laser system 10 incorporating such apparatus. The beam splitter apparatus 26, in addition to splitting the split beams 28 and 30 from the beam 14 traveling the free space optical path 63, transmits the beam 14 along a free-space beam path 195, which can be substantially collinear with the free space beam path 63. The output collimator 194, disposed along the beam path 195, collects the beam to travel along an optical waveguide 196. The optical waveguide 196 can convey the beam 14 to a modulator for impression of a telecommunication signal on the beam. Such an "in-line" design as of a monitoring apparatus 18 can advantageously readily be incorporated into practical laser systems, for example, as used in the Cable Television (CATV) industry.

Figure 9A:
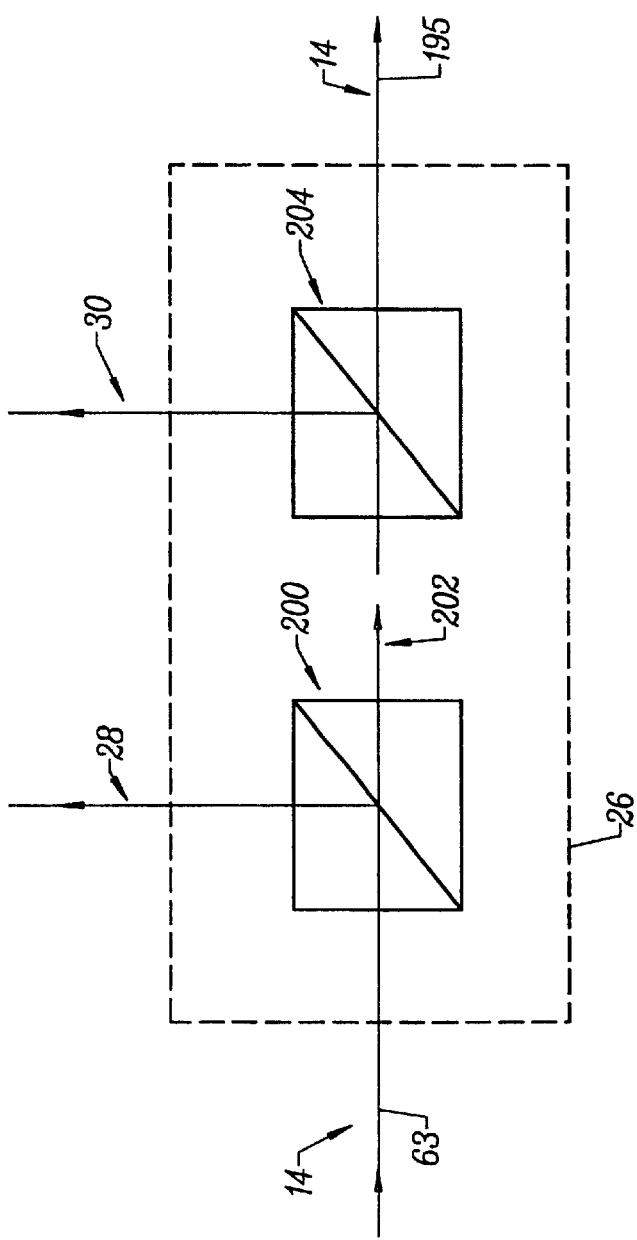
FIGS. 9A and 9B illustrates examples of the beamsplitter apparatus illustrated in FIG. 8.
Figure 9B:
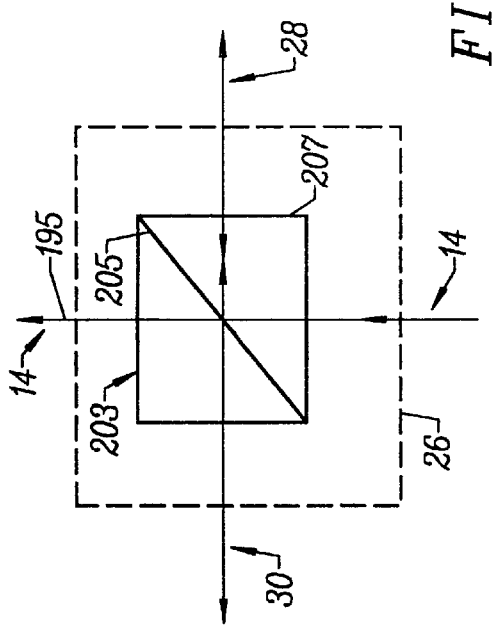

FIGS. 9A and 9B show two beam splitter apparatus 26 suitable for use in the laser wavelength monitoring apparatus 18 of FIG. 8. In FIG. 9A, two free-space beamsplitters 200 and 204 cooperate as shown to split the first and second split beams 28 and 30, respectively, from the beam 14 propagating along the free-space path 63 and to transmit the beam along the free-space output optical path 195. The first beam splitter splits the beam 14 into the first split beam 28 and an intermediate beam 202; the second beam splitter 204 splits the beam 202 into the second split beam 30 and the beam 14 traveling the optical path 195. Note that term "splitting," as used herein, does not necessitate that the power of an incident beam is split equally into the split beams by a beamsplitter. FIG. 9B illustrates a beamsplitter apparatus 26 wherein a single beamsplitter 203 has partially reflective surfaces 205 and 207 that cooperate to produce the beam 28 and 30, as well as to pass the beam 14 along optical path 195.

Figure 10:
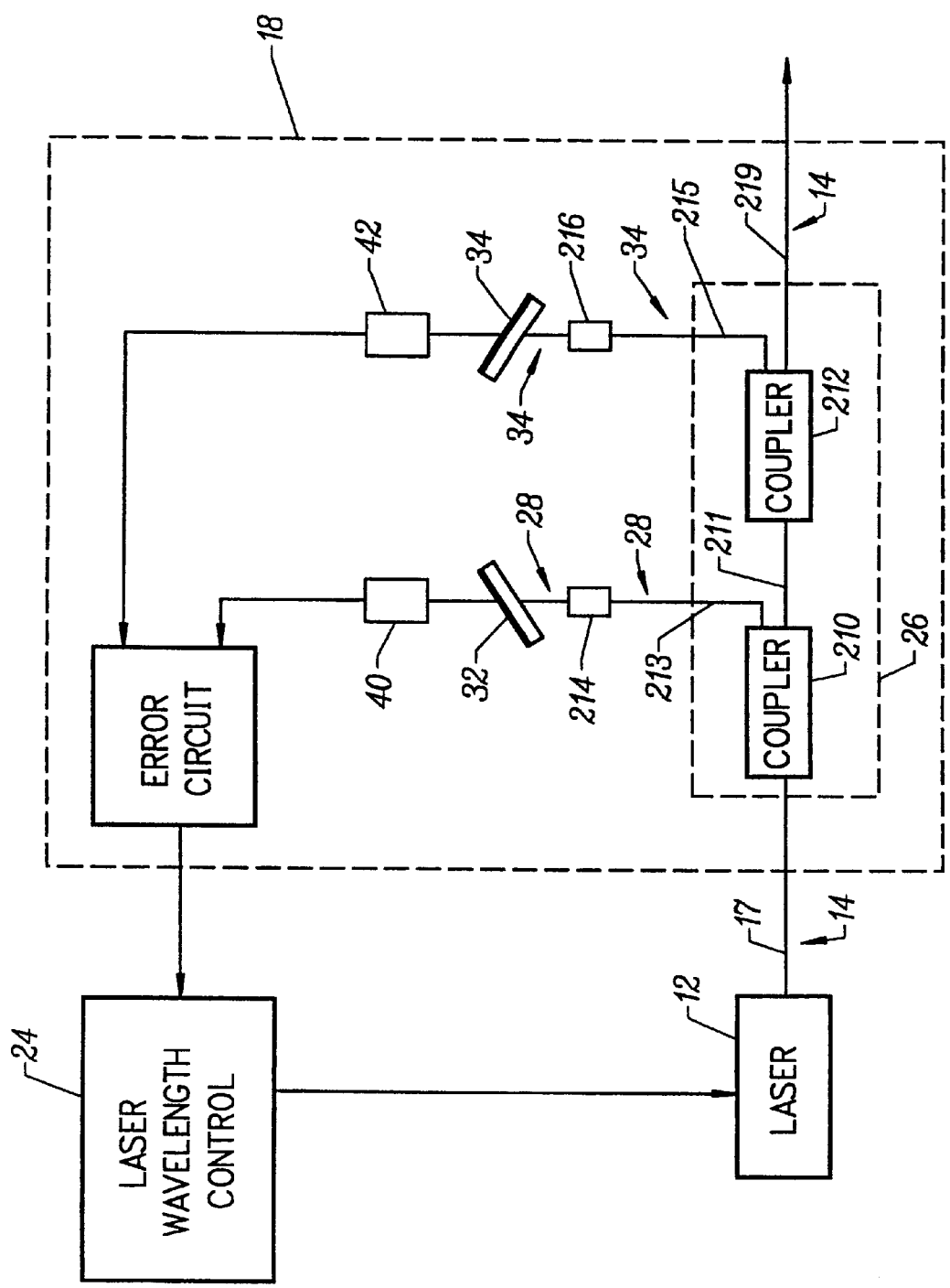
FIG. 10 illustrates another embodiment of the laser system and wavelength monitoring apparatus illustrated in FIG. 1.

FIG. 10 illustrates another embodiment of a laser wavelength monitoring apparatus 18 and a laser system 10 incorporating the apparatus 18. The beamsplitter apparatus 26 receives the beam 14 propagating along an optical fiber 17. A first fiber optic coupler 210 splits the first split beam 28 from the beam, and a second fiber optic coupler 212 receives the beam from the first optical fiber coupler 210 via an optical fiber 211 and splits off the second split beam 34 to propagate along an optical fiber 215. The beam 14 exits the second optical fiber coupler 212 along the optical fiber 219. Collimator 214 and 216 collimate the first and second split beams before the beams are filtered, respectively, by the first and second optical filters 32 and 34.

Figure 11A:
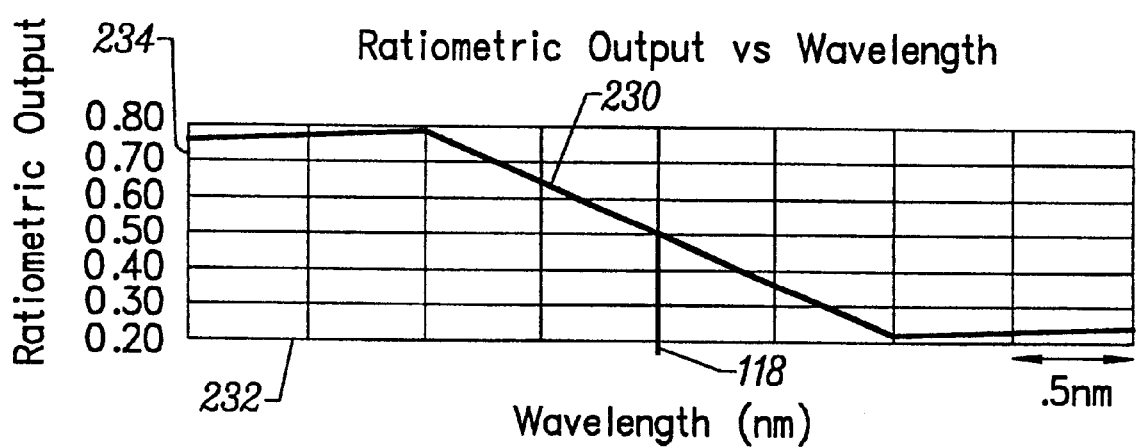
FIG. 11A illustrates the error signal of FIG. 1 as derived from a ratio of the outputs of the first and second detectors of FIG. 1.

Returning briefly to FIG. 3B, a useful error signal can be derived not only by subtracting the first and second detected signals, 44 and 46, but by taking a ratio of the signals as well. In FIG. 11A, the curve 230 graphically illustrates deriving an error signal from the ratio of the first detected signal to the sum of the first and second detected signals. The vertical axis 234 is the value of the above ratio and the horizontal axis 232 is wavelength. A ratio of ½ can correspond to the crossing wavelength 118.

Figure 11B:
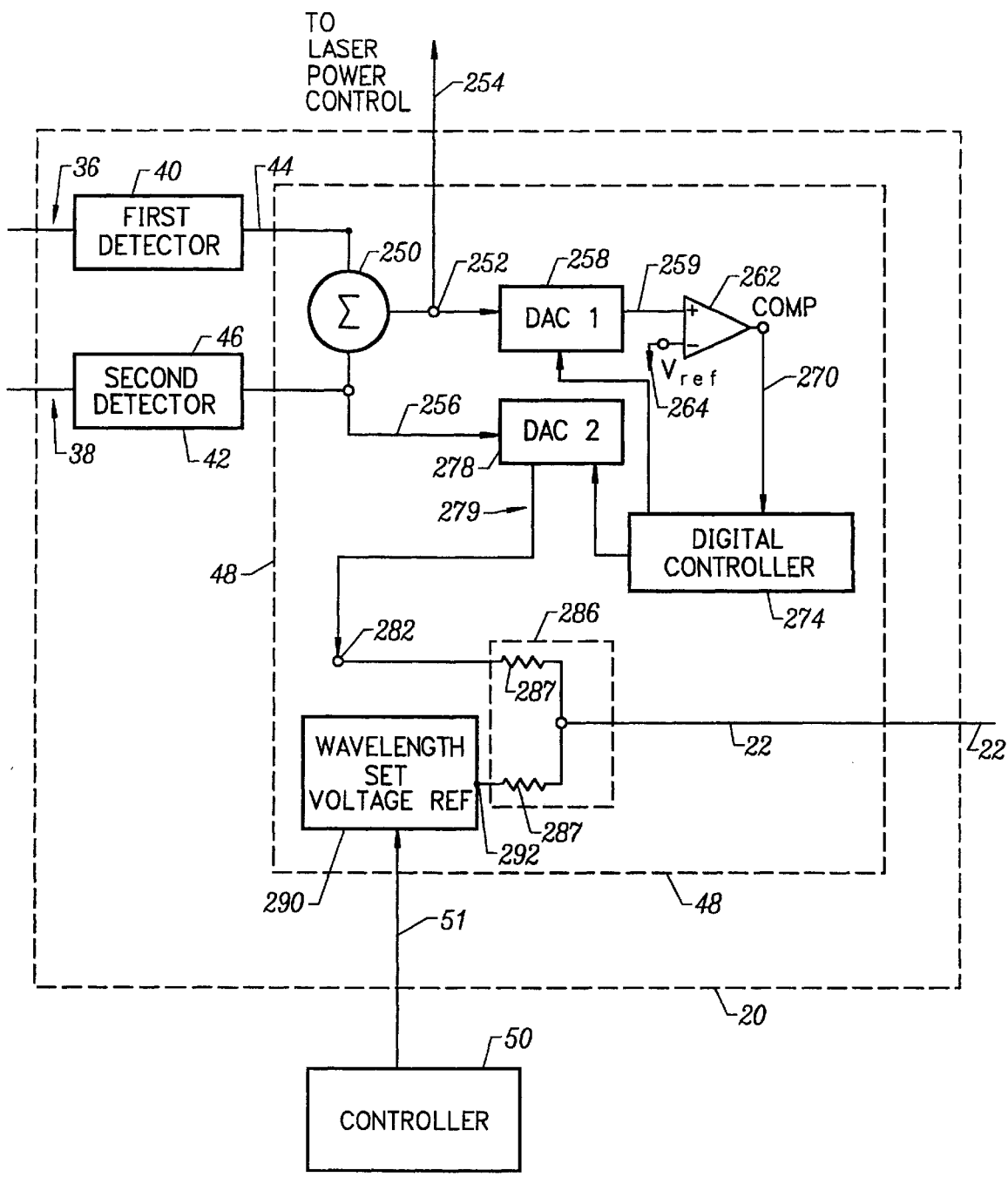
FIG. 11B illustrates one error circuit for producing the error signal by taking the ratio indicated in FIG. 11A.

FIG. 11B illustrates a beam comparison element 20 including a preferred embodiment of an error circuit 48 for ratioing the first and second detected signals 44 and 46. The summer 250, which can be a simple two resistor network, sums the first and second detected signals 44 and 46. One advantage of using the sum of the first and second detected signals in a ratio is that the voltage at point 252 is proportional to the total power being radiated by, for example, the laser 12 of FIG. 1, and can be made available, as indicated by reference number 254, for external use, such as in a leveling circuit for stabilizing the power output of a system laser 12. A differencing error circuit, such as the circuits of FIGS. 5A–5D, do not typically provide such a signal.

The digital controller 274 senses the output of the comparator 262 to adjust the gain of the first digital-to-analog converter (DAC) 258 such that the output voltage 259 of the first DAC 258 supplied to the plus input of the comparator 262 is equal to a reference voltage Vref 264 provided to the negative input of the comparator 262. Accordingly, the gain of the first DAC 258, G1, multiplied by the sum of the first and second detected signals is equal to the voltage Vref.

$$Vref = (\text{first detected signal } 44 + \text{second detected signal } 46) \times G1$$

The digital controller 274 controls the second DAC 278 such that gain G2 of the second DAC 278 applied to the second detected signal 44 is equal to the gain G1 of the first DAC 278. Thus $$G1 = G2 \; Vref/(\text{first detected signal } 44 + \text{second detected signal } 46)$$

and the voltage output 279 of the second DAC 278 is $$\text{second detected signal } 46 \times G1 = (\text{second detected signal } 46 \times Vref)/(\text{first detected signal } 44 + \text{second detected signal } 46)$$

A combiner 286, which can be a simple two resistor network including resistors 287, adds the output of the second DAC 278 to a set-point reference voltage (which is typically negative) provided by a set-point voltage reference supply 290 to provide the error signal 22.

Figure 12:
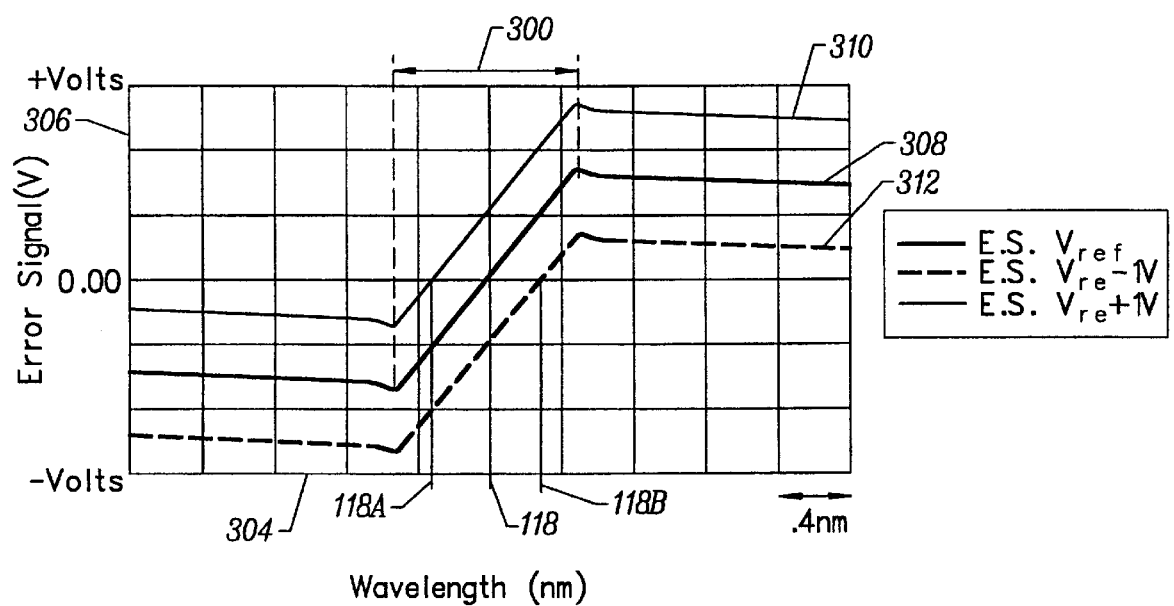
FIG. 12 illustrates varying the set-point wavelength and the error signal by adjusting the set-point reference voltage of the ratioing error circuit of FIG. 11B.

FIG. 12 illustrates the biasing of the set-point wavelength as a function of the voltage of the set-point reference voltage 290. Increasing the voltage of the set-point reference voltage 290 shifts the curve 308 to the curve 310, and the set-point wavelength 110 to the point 118A. Decreasing the wavelength reference voltage shifts the curve 308 to the curve 312, such that the wavelength set voltage shifts to the point 118B. Note that the curves 308, 310 and 312 are evenly spaced and not compressed as the curves 172, 174, and 176 of FIG. 6, illustrating an advantage of the ratio error circuit of FIG. 11A. Reference numeral 300 indicates the normal tuning range of the error signal curve 308. As indicated in FIG. 11B, the controller 50 can control the supply 290 for biasing the set-point wavelength.

In addition to the above-stated advantage of producing a signal 254 is that is proportional to the total power radiated by the laser 12, the ratio error circuit 28 of FIG. 11B is considered to have certain other advantages over the differencing error circuits of FIGS. 5A–5D. The range over which the error voltage 22 varies is less affected by changes in the optical power of the of the laser 12, and hence of the first and second filtered beams 36 and 38. Thus the control of the laser 12 via the provision of the error signal 22 to the laser controller 24 is not as affected by variations in optical power. Furthermore, the first DAC 258 and the second DAC 278 can be matched and will typically perform repeatably for extended periods, thereby providing a stable wavelength set-point.

Regarding the generation of the error signal 22, one of ordinary skill in the art, in light of the disclosure herein, understands that the error signal 22 can undergo additional processing as part of its provision to the laser wavelength controller 24. Typically, such processing includes amplification and/or integration of the signal. An integrator can be included for reducing residual error in the error signal that can otherwise be present when the wavelength of the beam 14, or equivalently, of the laser 12, is close to the set-point wavelength and the error signal is small. These considerations apply to the error circuits discussed in conjunction with FIGS. 5A–5D as well.

Figures 13A, 13B:
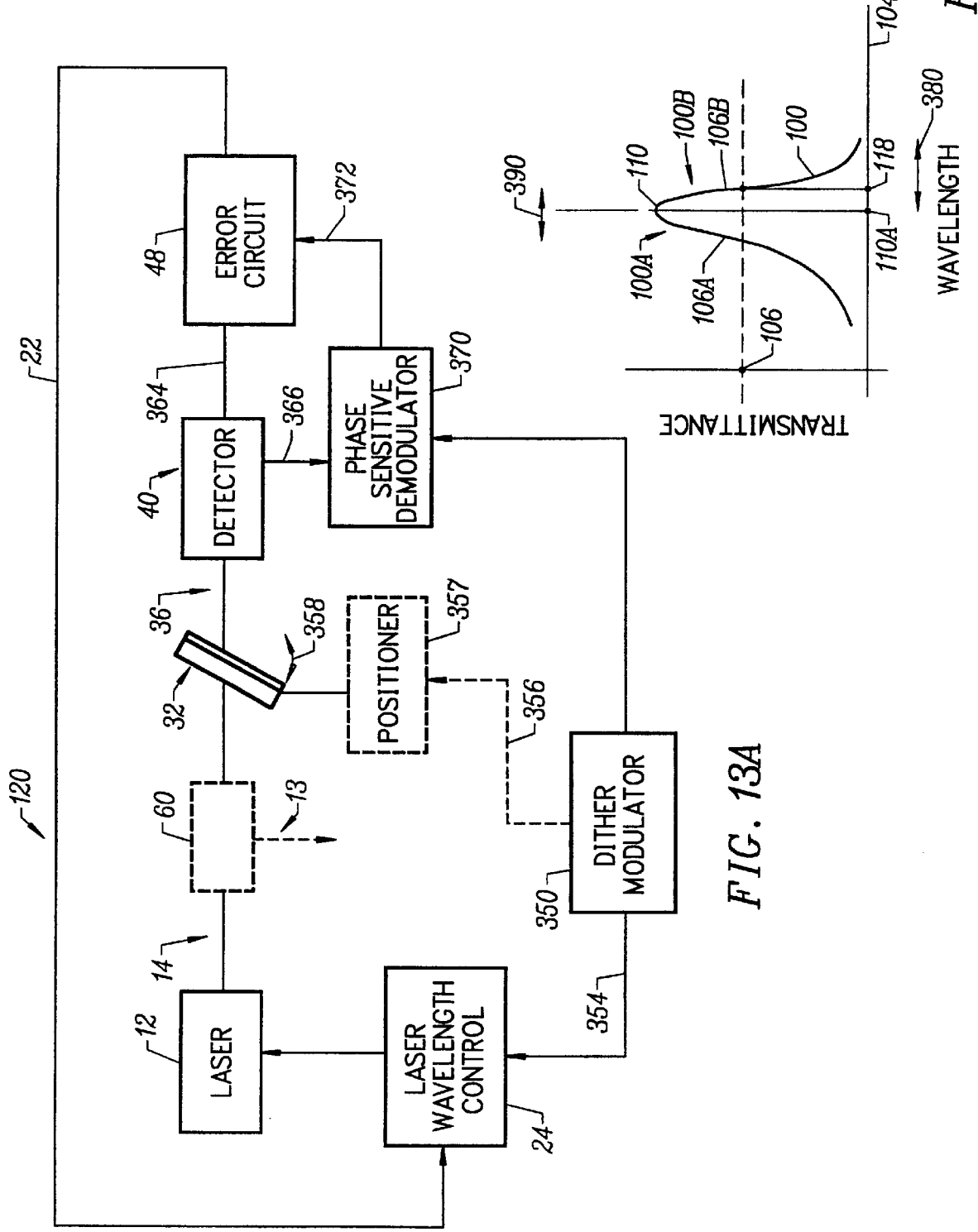
FIG. 13 illustrates another embodiment of the laser system and laser wavelength monitoring apparatus of FIG. 11.

FIGS. 13A and 13B illustrate the use of one optical filter, such as the first optical filter 32, and one detector, such as the first detector 40, in a laser system 120. FIG. 13B shows the SFF 100 for the first optical filter 32, which may or may not be angle tuned. A set-point wavelength 118 can correspond to the point 106B of the SFF 100. However, because the SFF 100 is equal at the points 106A and 106B, it is important to ensure that the first filtered beam 32 does indeed have a wavelength corresponding to negative slope 100B of the SFF 100 rather than the positive slope 100A. The slopes 110A and 100B, or portions thereof, can define, respectively, second and first tuning ranges. A dither modulator 350 can communicate with the laser wavelength control 24 or with the positioner 357, which can be a piezoelectric transducer or a stepper motor to impart a dither 380 in the wavelength or a dither 390 in the SFF. On the positive slope 106A, the intensity of the filtered beam 364 will change in phase with the dither; on the negative slope 106B it will change out of phase with the dither. Accordingly, a phase sensitive modulator 370 communicates with the dither modulator 350 to demodulate the detected signal for communicating with the error circuit 48, as indicated by reference numeral 372, to ensure operation on the positive slope 106B (i.e., in the proper tuning range) or to inform the error circuit of which slope to use in determining the error signal. The error circuit 48 includes an offset provision to account for the non zero detected signal 364 when the wavelength of the beam is equal to the set-point wavelength 118.

Figure 14:
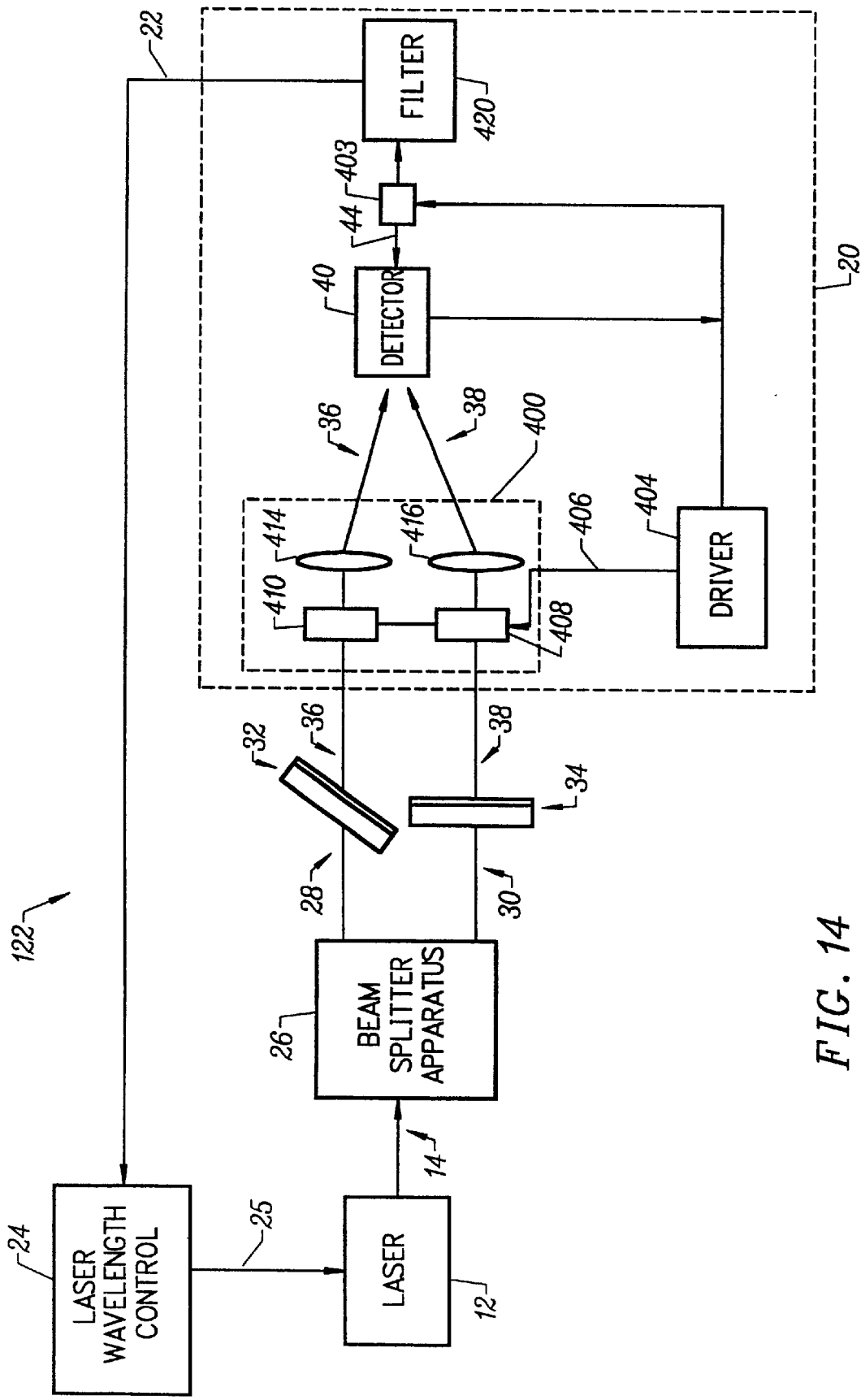
FIG. 14 illustrates a further embodiment of the laser system and laser wavelength monitoring apparatus of FIG. 1.

FIG. 14 illustrates a laser system 122 including provision for wavelength monitoring and control wherein the beam comparison element 20 time division multiplexes the first and second filtered beams onto a single detector. A switch driver 404 drives optical switches 408 and 410 for alternately switching the beams 36 and 38 to the detector 40. Optics elements 414 and 416 direct the first and second filtered beams, when passed by the switches 410 and 408, to the detector 40. The driver 404 communicates with a switch 403 for inverting the first detected signal communicated from the detector 403 to the filter 420 when the optical switch 410 directs the first filtered beam 36 to the detector 40. Accordingly, the filter 420 provides an output error signal for provision to the laser wavelength control 24, as indicated by reference numeral 22. As with the switch driver 162 of FIG. 5C, the duty cycle of the switch driver 404 can be varied for varying the set-point wavelength.

Figure 15:
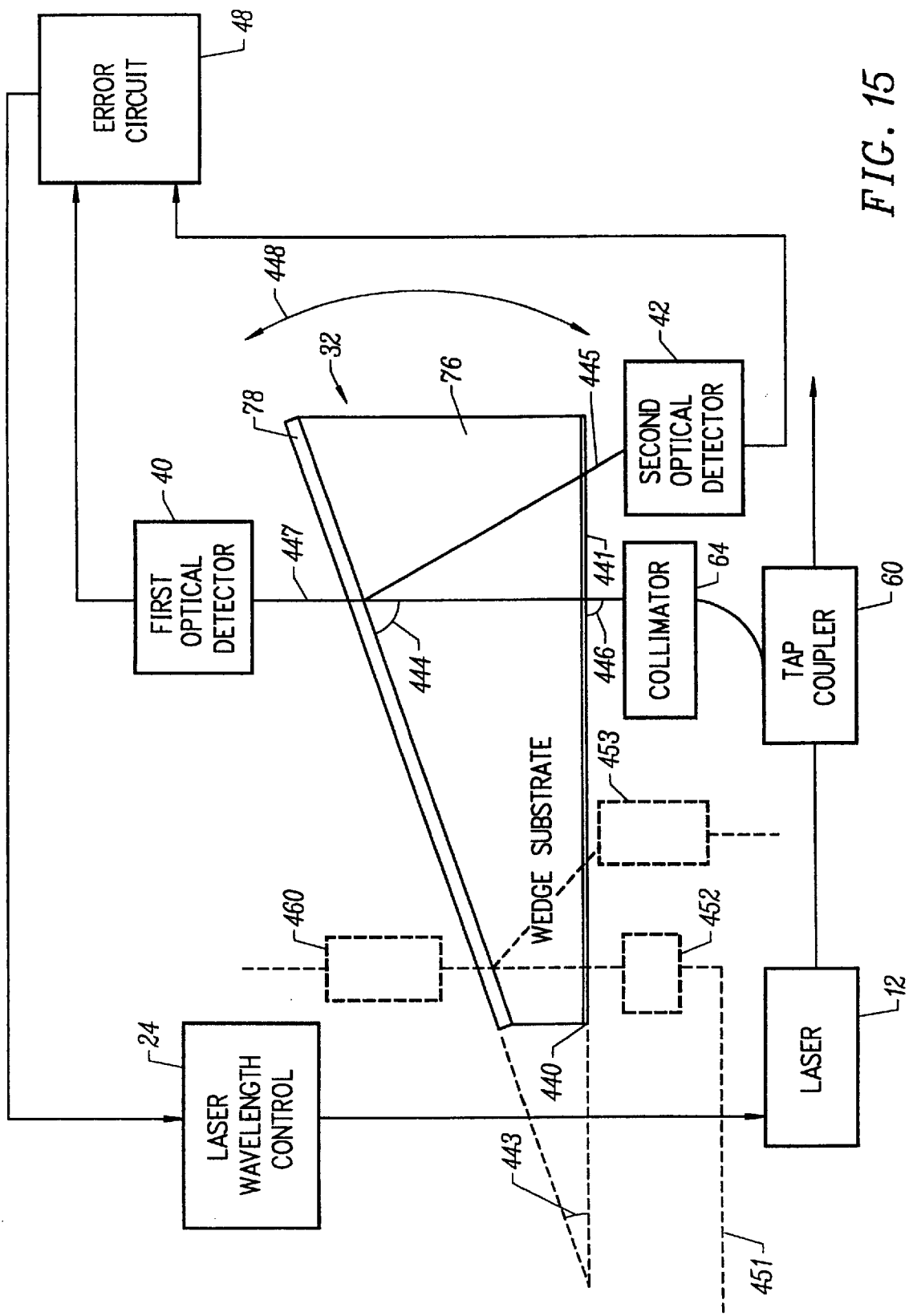
FIG. 15 illustrates yet another embodiment of the laser system and laser wavelength monitoring apparatus of FIG. 1.

FIG. 15 illustrates yet another embodiment of the laser system 10 incorporating the laser wavelength monitoring apparatus 18 of FIG. 1.

The tap coupler 60 taps a portion the laser radiation emanated by the laser 12. The collimator 64 collimates the radiation, which is incident on a first surface of the optical filter 32 at the angle 446 and on the filter layer 78 at an angle of incidence 444, which is related to the angle 446 by the wedge angle 443. As illustrated, the angle 446 can be ninety degrees. The substrate 76 is wedge shaped to reduce etalon effects and in addition to the filter layer 78 can include a non-reflective coating 440. The optical filter 32 transmits a first filtered beam 447 in accordance with a first spectral filter function and reflects a second filtered beam 445 in accordance with a second spectral filter function.

The first optical detector 40 receives the first filtered beam 447 for producing a first detected signal; the second optical detector receives the second optical beam 445 for producing a second detected signal. The error circuit 48, responsive to the first and second detected signals, produces an error signal, which can be provided to the laser wavelength controller 24, for controlling the wavelength of the radiation emanating from the laser 12.

Figure 16:
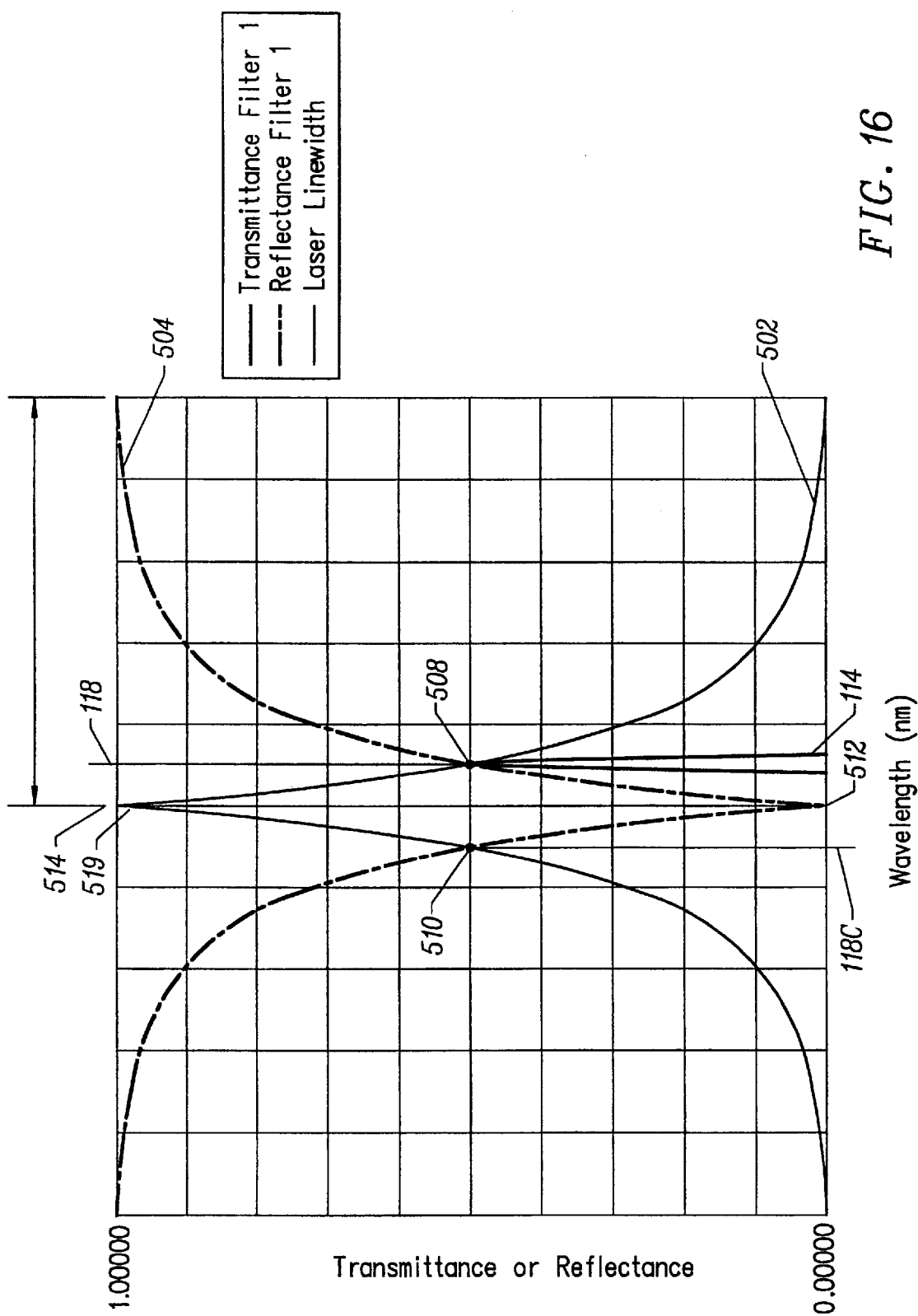
FIG. 16 illustrates first and second spectral filter functions corresponding to reflected and transmitted beams, respectively, produced by the optical filter of FIG. 15.

FIG. 16 illustrates the first and second spectral filter functions 502 (solid line) and 504 (broken line) corresponding to first and second filtered beams, 447 and 445, respectively. The first and second spectral filter functions 502 and 504 are inversely related, the first spectral filter function having a resonant response 513 corresponding to a peak and the second spectral filter function having a resonant response 512 corresponding to a null. As understood by one of ordinary skill in the art, the wavelength at which the resonant responses 513 and 512 occur are equal, or typically very nearly equal, and for convenience are both represented in FIG. 16 by reference numeral 514. The first and second spectral filter function cross at points 508 and 510, corresponding to first and second crossing wavelengths 118 and 118C. As understood by one of ordinary skill in the art, in light of the disclosure herein, the substrate 32 in FIG. 15 need not have a wedge shape. Furthermore, positioning the substrate 32 as described above or varying the wedge angle 443 shifts both the first and second spectral filter functions along the horizontal wavelength axis in FIG. 16, varying the crossing point wavelengths 118 and 118C (as well as the peak and null wavelengths). The line width 114 represents the laser radiation from the laser 12.

Figure 17:
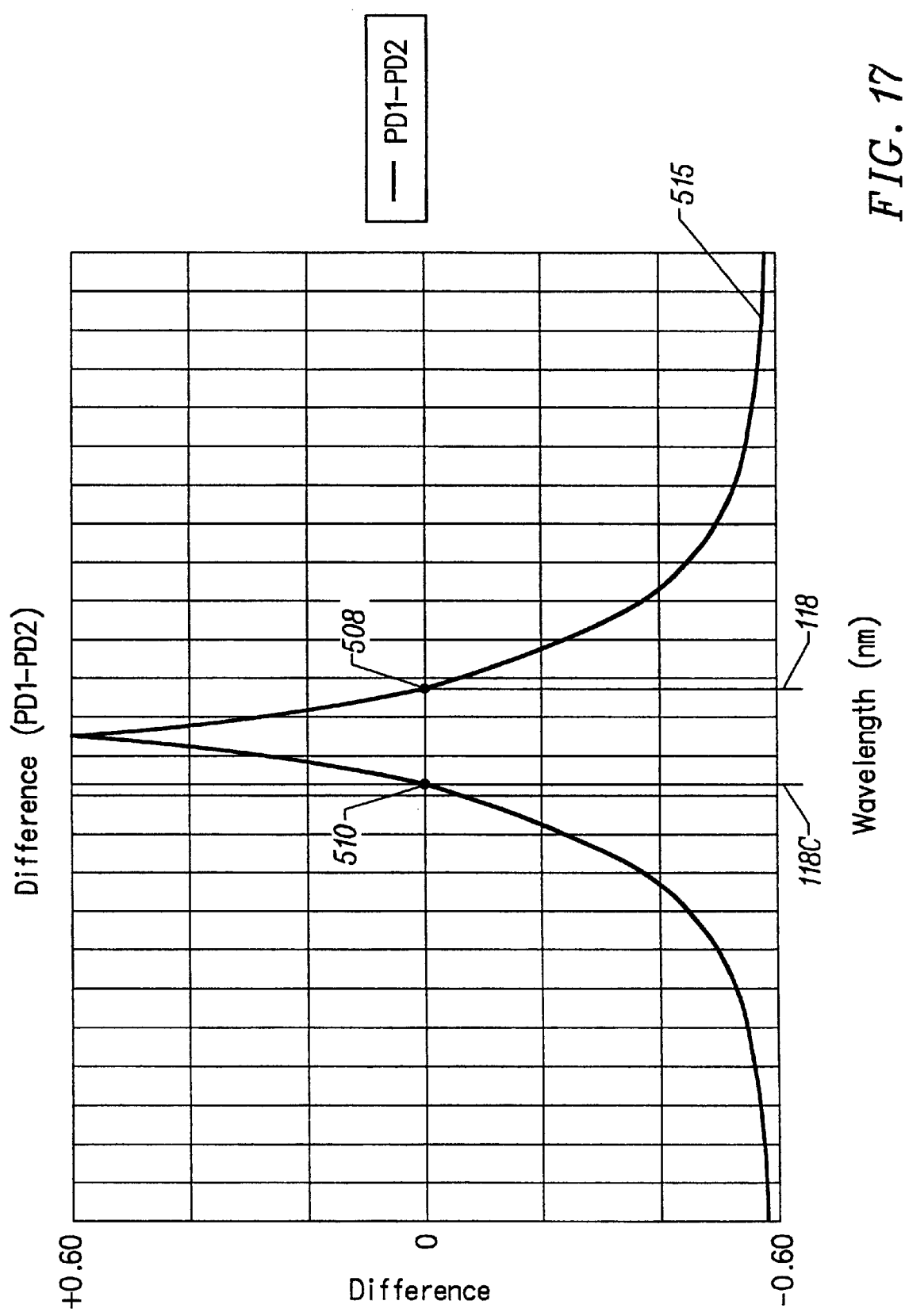
FIG. 17 illustrates the error signal as derived from the difference between the intensities of the reflected and transmitted beams of FIG. 16.

FIG. 17 illustrates the error signal obtained from the difference between the intensities of the reflected and transmitted beams of FIG. 16, typically derived by differencing the first and second detected signals. As discussed above, the error signal can also be derived by taking a ratio involving the first and second detected signals. Reference numerals 508 and 510 correspond to the crossing point wavelengths 118 and 118C respectively.

With reference again to FIG. 15, the substrate 32 can be used to monitor or control a second beam of laser radiation, spatially separated from the beam radiated by the laser 12, and having a wavelength differing therefrom. One of the crossing point wavelengths, such as 118C is used for control and/or monitoring the wavelength of the second beam, while the other is used in conjunction with the beam of radiation emanating from the laser 12. The second beam can proceed along the beam path 451. Optional third and fourth optical detectors 460 and 453 produce third and fourth detected signals for provision to an additional error circuit (not shown). Thus one optical filter 32 can be used to control or monitor the wavelength of two beams of radiation. As understood by one of ordinary skill in the art, in light of the disclosure herein, the resonant response wavelengths and the bandwidth of the first and second spectral filter functions are properly selected to provide selected crossing points and capture or tuning ranges appropriate for the channels whose wavelength is to be monitored and/or controlled. Resonant response frequencies, bandwidths and crossing points can be selected by proper selection of the thicknesses and dielectric constants of the film layers of the filter layer, dielectric constant and thickness of the substrate, and angle of incidence of the beam received by the filter, among other factors. The set-point wavelengths can be individually biased from the crossing wavelengths, using techniques described above. Thus the number of physically distinct filters required for operating a DWDM system of a given number of channel can be reduced.

Figure 18:
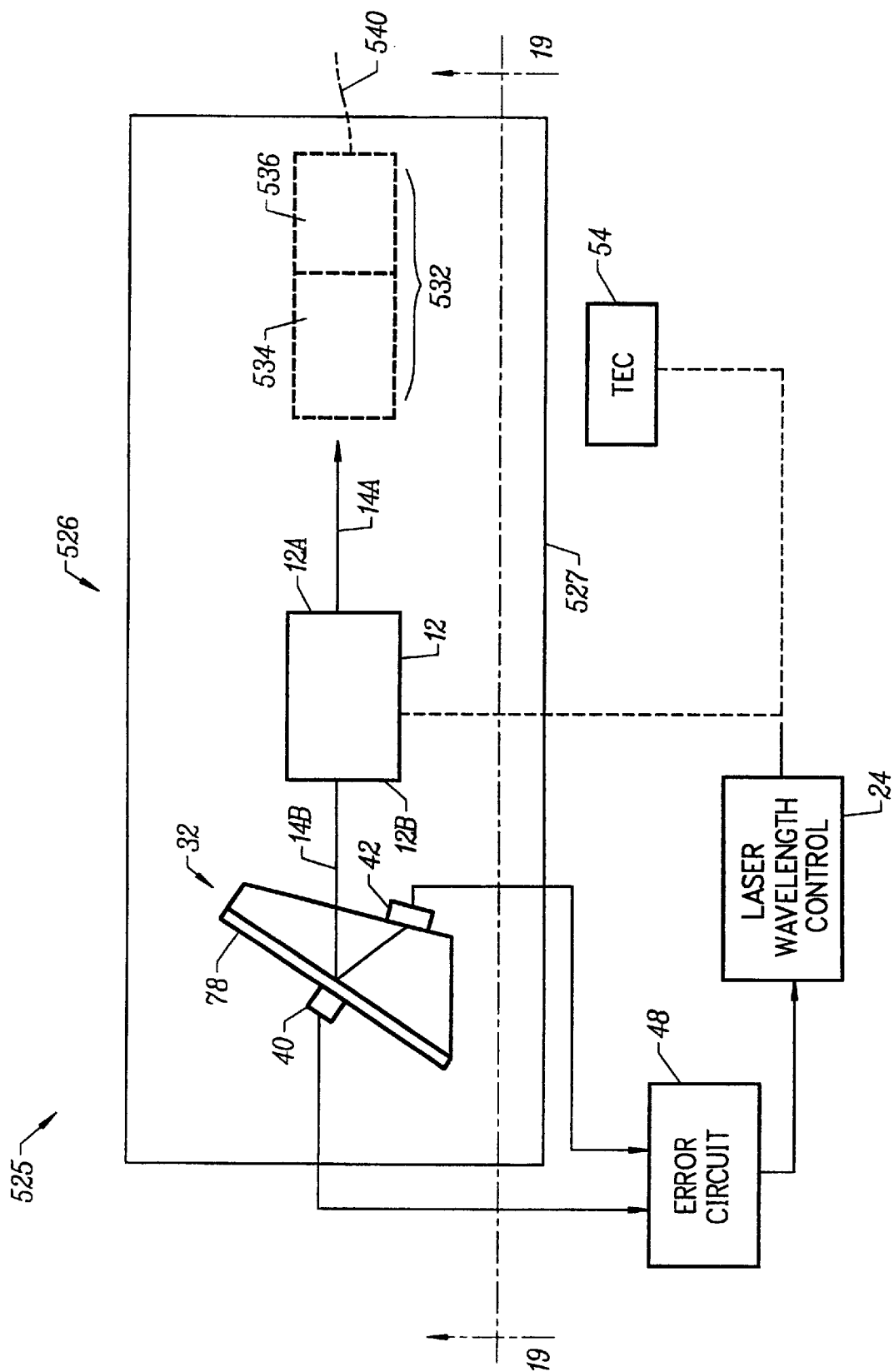
FIG. 18 illustrates yet another embodiment of laser apparatus according to the invention.
Figure 19:
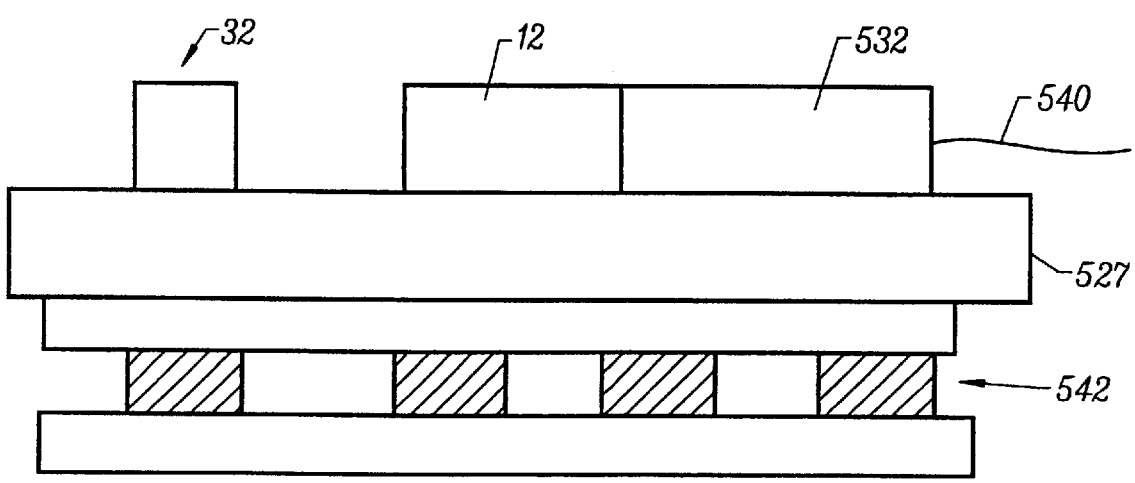
FIG. 19 illustrates a cross-sectional view of the laser apparatus of FIG. 18 an illustrating a thermoelectric cooler.

FIG. 18 illustrates a preferred embodiment 525 of a laser apparatus according to the invention, including a semiconductor laser 12 emanating laser radiation from two facets 12A and 12B. Various techniques are disclosed above for providing a sample of the a beam of radiation from a laser to at least one optical filter. In the embodiment shown in FIG. 18, the beam 14A emanates from a front facet 12A and the beam 14B emanates from a rear facet 12B of the laser 12. The optical filter 32 receives the beam 14B for monitoring and control, such as tuning or stabilization, of the beams 14A and 14B. A support 527 mounts the laser 12 and the filter 32, and is preferably a thermal conductor for providing thermal communication with a thermoelectric cooler, as shown in FIG. 19, which illustrates the apparatus of FIG. 18 in cross section. The laser wavelength controller 24 can control the laser directly, such as by controlling the excitation current provided to the laser, can control the thermoelectric cooler 54 that is in thermal communication with the laser 12 via the thermal conductor 12. A modulator 534 and fiber optic coupler 536, having a fiber optic cable output 540, can also be included in thermal communication with the thermal conductor 527. The filter 32 mounts the detectors 40 and 42 for thermal communication with the substrate 76, and hence with the thermal conductor 527 and the thermoelectric cooler 542.

The laser apparatus 525 is considered to have several advantages. A compact, in-line design is provided. The components 12, 32 and 532 mounted with the thermal conductor 527 can form a channel transmit module 526 that is readily inserted and replaced in DWDM communications transmitter. Drift due to temperature effects is reduced, as the filter, detectors and laser are maintained at the same temperature. In addition, the laser apparatus 525 need not require a beamsplitter, as the beams reflected from and transmitted by the filter 32 are spatially separated. The laser can be a tunable semiconductor laser such as: a distributed Back Reflection (DBR) laser; a distributed feedback (DFB) laser; a super structure grating distributed back reflection (SSG-DBR) laser; and a grating assisted coupler with sampled rear reflector (GSCR) laser. Particularly useful is a laser that emanates a wavelength substantially equal to 980 nm and that is suitable as a pump laser for an erbium doped fiber amplifier, or a laser 12 that emanates radiation of a wavelength substantially equal to 1550 nm. Furthermore, the laser 12 can be a semiconductor laser tunable over a range of approximately 60 nm, where the range includes 1150 nm, allowing tunable operation over the complete bandwidth of a typical erbium-doped fiber amplifier. The operating wavelength of the laser 12 is selected by biasing the set-point wavelength, as described above, or by proper selection of the first and second SFF's of the optical filter 32, or both. Thus, according to the invention there is provided a laser apparatus 525 that can provide radiation at the wavelength of any of a plurality of the channels of a DWDM system.

It will thus be seen that the invention efficiently attains the objects set forth above, among those made apparent from the preceding description. Because certain changes may be made in the above constructions without departing from the scope of the invention, it is intended that all matter presented in the above description or shown in the accompanying drawings be interpreted as illustrative and not as limiting. For example, as understood by one of ordinary skill in the art, in light of the disclosure herein, many techniques and circuits described above in conjunction with the use of two optical filters are also suitable for use with a single filter, such as the filter 32 shown in FIG. 18, that transmits and reflects the first and second filtered beams, respectively, and such variations are considered within the scope of the invention. As one example, proper routing of filtered beams can allow use of a single detector, as illustrated in FIG. 14, with optical filter 32 shown in FIG. 15.

It is also understood that the following claims are to cover all generic and specific features of the invention described herein, and all statements of the scope of the invention which as a matter of language, might be said to fall therebetween.

Having described the invention, what is claimed as new and secured by Letters Patent is:

1. A laser apparatus, comprising:

a laser for producing a beam of laser radiation having a selected wavelength;

means for splitting first and second laser light beams from said beam of laser radiation;

a first optical filter disposed for receiving at least a portion of said first split beam, said first filter producing a first filtered beam in accordance with a first spectral filter function;

a photodetector for receiving at least a portion of said first filtered beam and for producing a first detector signal;

a second optical filter disposed for receiving at least a portion of said second split beam and for producing a second filtered beam in accordance with a second spectral filter function;

a second photodetector for receiving at least a portion of said second split beam and for producing a second detected signal;

said first filter including a substrate having a filter layer, said filter layer including at least one film layer having a dielectric constant differing from that of said substrate, an error signal circuit in electrical communication with said first and second photodetectors for generating an error signal responsive to said first and second detected signals and representative of the deviation of the wavelength of the laser radiation from a set-point wavelength;

a laser wavelength control element in electrical communication with said error circuit for adjusting the operating temperature of said laser in response to said error signal so as to tend toward said set-point wavelength; and wherein said first split beam is incident on a surface of one of said substrate and said filter layer at a non-zero angle of incidence.

2. The apparatus of claim 1 wherein said laser is a tunable monolithic semiconductor laser.

3. The apparatus of claim 1 wherein said laser can produce laser radiation wherein the wavelength is substantially equal to 980 nm and said laser is suitable as a pump laser for an erbium doped fiber amplifier.

4. The apparatus of claim 1 wherein said laser can produce laser radiation wherein the wavelength is substantially equal to 1550 nm.

5. The apparatus of claim 1 wherein said laser is tunable over a range of approximately 60 nm, said range including a wavelength of 1550 nm.

6. The apparatus of claim 1 wherein said laser is one of a distributed Back Reflection (DBR) laser; a distributed feedback (DFB) laser; a super structure grating distributed back reflection (SSG-DBR) laser; and a grating assisted coupler with sampled rear reflector (GSCR) laser.

7. A method of calibrating a laser wavelength apparatus, the method comprising the steps of:

operating a laser at a first wavelength provide a laser beam having the first wavelength;

filtering at least a first portion of the laser beam with a first optical filter to produce a filtered beam in accordance with a first spectral filter function having a resonant response at resonance response wavelength;

measuring the intensity of said first filtered beam;

filtering at least a second portion of the laser beam with a second optical filter to produce a second filtered beam, the second optical filter including a substrate having a filter layer thereon, said filter layer including at least one film layer having an index of refracting different from that of the substrate, said step of filtering including directing the beam of radiation to a surface of one of said substrate and said filter layer at an initial angle of incidence;

monitoring the measured intensity of said second filtered beam; and selecting a final angle of incidence, the step of selecting including adjusting the angle of incidence of the laser beam to said surface to vary the spectral filter function of the second filter such that the intensity of said second filtered beam is substantially equal to the intensity of said first filtered beam.

* * * * *